(12) United States Patent
Naono et al.

(10) Patent No.: US 12,130,424 B2
(45) Date of Patent: Oct. 29, 2024

(54) MICROMIRROR DEVICE

(71) Applicant: FUJIFILM Corporation, Tokyo (JP)

(72) Inventors: Takayuki Naono, Kanagawa (JP);
Keisuke Aoshima, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 483 days.

(21) Appl. No.: 17/508,698

(22) Filed: Oct. 22, 2021

(65) Prior Publication Data

US 2022/0043256 A1 Feb. 10, 2022

Related U.S. Application Data

(63) Continuation of application No. PCT/JP2020/017848, filed on Apr. 24, 2020.

(30) Foreign Application Priority Data

Apr. 26, 2019 (JP) .................................. 2019-086634
Apr. 23, 2020 (JP) .................................. 2020-076927

(51) Int. Cl.
*G02B 26/00* (2006.01)
*G02B 26/08* (2006.01)
*G02B 26/10* (2006.01)

(52) U.S. Cl.
CPC ......... *G02B 26/0833* (2013.01); *G02B 26/10* (2013.01)

(58) Field of Classification Search
CPC .. G02B 26/0833; G02B 26/10; G02B 26/101; G02B 26/0858; G02B 26/105; G02B 26/121; B81B 3/00

(Continued)

(56) References Cited

U.S. PATENT DOCUMENTS 7,436,567 B2   10/2008   Ueyama
2012/0026567 A1   2/2012   Murayama et al.
(Continued)

FOREIGN PATENT DOCUMENTS

JP   2009-192967 A   8/2009
JP   2010-288435 A   12/2010
(Continued)

OTHER PUBLICATIONS

Extended European Search Report for corresponding European Application No. 20796443.8, dated Sep. 29, 2022.
(Continued)

*Primary Examiner* — Henry Duong
(74) *Attorney, Agent, or Firm* — Birch, Stewart, Kolasch & Birch, LLP

(57) ABSTRACT

A micromirror device includes: a mirror part; a first actuator in which a pair of semi-annular actuator parts surrounds the mirror part; a connecting part that connects the mirror part and the first actuator such that the mirror part is rotatable around a first axis; a fixing part that is disposed at an outer periphery of the first actuator; and a second actuator in which a pair of meandering type actuator parts are disposed with the first actuator interposed therebetween. Each of the pair of meandering type actuator parts is disposed such that a longitudinal direction of the rectangular plate-like part is a direction along the first axis, one end of each meandering type actuator part is connected to an outer periphery of each of the pair of semi-annular actuator parts, and another end of each meandering type actuator part is connected to the fixing part.

8 Claims, 21 Drawing Sheets

(58) Field of Classification Search
USPC .................................................. 359/221.2
See application file for complete search history.

(56) References Cited

U.S. PATENT DOCUMENTS

| | | |
|---|---|---|
| 2012/0062970 A1 | 3/2012 | Yamada et al. |
| 2014/0185116 A1 | 7/2014 | Kugo |
| 2015/0022871 A1 | 1/2015 | Naono |
| 2015/0277107 A1 | 10/2015 | Aimono |
| 2016/0341956 A1* | 11/2016 | Yasuda ............... H10N 30/076 |
| 2018/0065149 A1 | 3/2018 | Morikawa et al. |
| 2018/0067304 A1 | 3/2018 | Hattass et al. |
| 2018/0088320 A1 | 3/2018 | Yamada |

FOREIGN PATENT DOCUMENTS

| | | |
|---|---|---|
| JP | 2012-32679 A | 2/2012 |
| JP | 4984117 B2 | 7/2012 |
| JP | 5151085 B2 | 2/2013 |
| JP | 5397184 B2 * | 1/2014 |
| JP | 2014-126725 A | 7/2014 |
| JP | 2015-22064 A | 2/2015 |
| JP | 2016-24223 A | 2/2016 |
| JP | 2016-102812 A | 6/2016 |
| JP | 2018-219603 A | 12/2016 |
| JP | 2017-9920 A | 1/2017 |
| JP | 2018-41085 A | 3/2018 |

OTHER PUBLICATIONS

International Preliminary Report on Patentability and English translation of the Written Opinion of the International Searching Authority (Forms PCT/IB/326, PCT/IB/373 and PCT/ISA/237) for International Application No. PCT/JP2020/017848, dated Nov. 4, 2021.
International Search Report (Form PCT/ISA/210) for International Application No. PCT/JP2020/017848. dated Jul. 28, 2020, with English translation.
Chinese Office Action and Search Report for corresponding Chinese Application No. 202080030807.3, dated Feb. 10, 2023, with a partial English translation.
Japanese Office Action for corresponding Japanese Application No. 2021-516311, dated Sep. 6, 2022, with English translation.

* cited by examiner

MICROMIRROR DEVICE

CROSS-REFERENCE TO RELATED APPLICATIONS

This application is a continuation application of International Application No. PCT/JP2020/017848, filed Apr. 24, 2020, the disclosure of which is incorporated herein by reference in its entirety. Further, this application claims priority from Japanese Patent Application No. 2019-086634, filed Apr. 26, 2019, and Japanese Patent Application No. 2020-076927, filed Apr. 23, 2020, the disclosures of which are incorporated herein by reference in their entirety.

BACKGROUND OF THE INVENTION

1. Field of the Invention

The present disclosure relates to a micromirror device.

2. Description of the Related Art

A micromirror device (also referred to as a micro-scanner) is known as one of the micro electro mechanical systems (MEMS) devices manufactured by using the microfabrication technology of silicon (Si). Since this micromirror device is small and has low consumed power, it is expected that the micromirror device is applied to head-up displays, retinal displays, and the like using lasers.

As an optical scanning method for displaying images, attention has been focused on a Lissajous scanning method of covering the screen by driving sinusoidally on both the horizontal and vertical axes and drawing a Lissajous waveform, as compared with the raster scanning method that has been common until now. In the Lissajous scanning method, the algorithm of the laser driver is complicated. However, the mirror can be miniaturized, and a wide angle of view can be realized while suppressing the driving consumed power.

There are various driving methods for micromirrors, but the piezoelectric driving method using deformation of a piezoelectric body is promising since the method generates a higher torque than other methods and is capable of obtaining a high scanning angle.

JP5151065B, JP4984117B, and JP2018-41085A propose a piezoelectric drive type optical scanner capable of two-dimensional scanning as a micromirror device.

JP5151065B discloses an optical scanner having a configuration in which the mirror part is connected to the movable frame through the first connecting part along the first axis and the movable frame is connected to the fixed frame surrounding the movable frame through the piezoelectric actuator. The movable frame and the piezoelectric actuator are connected by a second connecting part along the second axis orthogonal to the first axis, and the piezoelectric actuator is further connected to the fixed frame by a third connecting part along the first axis. A pair of movable parts are connected to each of the two third connecting parts disposed on the axis across the mirror part, and a total of four movable parts oscillate the mirror part around two axes together with the movable frame. Thereby, a two-dimensional light scanning operation is realized.

JP4984117B discloses an optical scanner comprising: a mirror part; a first actuator part that is disposed so as to surround the mirror part and connected to the mirror part through a first torsion bar extending along a first axis; an internal movable frame that is disposed outside the first actuator part and is connected to the first actuator part on the axis of the first torsion bar; and a second actuator part that is disposed so as to surround the internal movable frame and is connected to the internal movable frame through the second torsion bar. The first actuator part applies torque around the first axis to the mirror part, and the second actuator part applies torque around the second axis to the mirror part, thereby realizing a two-dimensional light scanning operation.

In JP2018-41085A, the mirror part is connected to the first frame device (the movable frame) that surrounds the mirror part through the first torsion bar, and the first frame device is connected to an actuator structure that surrounds the first frame device through the second torsion bar. Further, a configuration, in which the actuator structure is connected to a second frame device that surrounds the actuator through a third torsion bar, is disclosed. The actuator structure comprises four movable parts symmetrical to the first axis and the second axis, and the mirror part is rotated around the two axes by the four movable parts. Thereby, a two-dimensional light scanning operation is realized.

SUMMARY OF THE INVENTION

In order to realize a practical system such as a head-up display that displays high-definition images, it is necessary for the micromirror device to increase the frequency ratio of driving in the vertical axis direction and the horizontal axis direction in the Lissajous scanning method. Specifically, it is preferable that the ratio of frequencies is equal to or greater than 15. However, from the viewpoint of general MEMS design, it is difficult to increase the ratio of resonance frequencies of orthogonal scan driving for the following reasons.

The resonance frequency is defined by the ratio of moment of inertia to rigidity. In order to increase the frequency on the high speed side, it is necessary to have a high rigid structure. On the other hand, in order to decrease the frequency on the low speed side, it is necessary to make the rigidity extremely small. However, it is difficult to make large and small rigidity by using silicon wafers of the same thickness. Specifically, in a case where the frequency on the high speed side is increased by increasing the thickness and increasing the rigidity, an extremely large structure is required to reduce the rigidity on the low speed side.

JP4984117B reports a structure in which the frequency on the low speed side is decreased by enlarging the structural part for high-speed driving (mirror+actuator for high-speed driving+movable frame) and increasing the moment of inertia. However, this structure has a problem that the overall chip size is large.

Various types of micromirrors have been reported so far, but there has been no device that is able to achieve both a small size and a large ratio of frequencies.

The present disclosure has been made in view of the above circumstances, and it is an object thereof to provide a compact micromirror device capable of sufficiently increasing the ratio of frequencies in the sinusoidal driving in the first axis direction and the second axis direction.

Specific means for solving the above problems includes the following aspects.

<1>

A micromirror device includes:
a mirror part that has a reflecting surface that reflects light;
a first actuator that includes a pair of semi-annular actuator parts, each including a piezoelectric element, and that is disposed such that the pair of semi-annular actuator parts surrounds the mirror part;

a connecting part that connects the mirror part and the first actuator such that the mirror part is rotatable around a first axis;

a fixing part that is disposed at an outer periphery of the first actuator; and a second actuator that is disposed between the first actuator and the fixing part and includes a pair of meandering type actuator parts, each including one or more rectangular plate-like parts that include a piezoelectric element, each of the pair of meandering type actuator parts is disposed such that a longitudinal direction of the rectangular plate-like part is a direction along the first axis, one end of each of the pair of meandering type actuator parts is connected to an outer periphery of each of the pair of semi-annular actuator parts, and another end of each of the pair of meandering type actuator parts is connected to the fixing part, each piezoelectric element has a structure in which a lower electrode, a piezoelectric film, and an upper electrode are layered, and the first actuator applies a rotational torque around the first axis to the mirror part, and the second actuator applies a rotational torque around a second axis intersecting with the first axis to the first actuator, so as to two-dimensionally rotationally drive the mirror part around the first axis and the second axis.

<2>

The micromirror device according to <1>, in which the meandering type actuator part includes two or more rectangular plate-like parts, and the two or more rectangular plate-like parts are connected so as to be folded back through a connecting part.

<3>

The micromirror device according to <1> or <2>, in which the upper electrode of each of the piezoelectric elements provided in each of the pair of semi-annular actuator parts includes a plurality of individual electrode parts, the plurality of individual electrode parts are disposed to be separated by stress inversion regions where positive and negative, of a principal stress component having a maximum absolute value among a principal stress generated in an in-plane direction of the piezoelectric film, are inverted, in a maximum displacement state, in a case of driving the mirror part in a first resonance mode in which the mirror part reciprocates and rotates around the first axis, and each of the piezoelectric elements includes a plurality of piezoelectric parts defined by each of the plurality of individual electrode parts.

<4>

The micromirror device according to any one of <1> to <3>, in which the connecting part connects the mirror part and one end of each of the pair of semi-annular actuator parts and connects the mirror part and another end of each of the pair of semi-annular actuator parts on the first axis.

<5>

The micromirror device according to any one of <1> to <4>, in which the upper electrode of each of the piezoelectric elements of each of the pair of semi-annular actuator parts consists of a plurality of individual electrode parts formed symmetrically about the first axis.

<6>

The micromirror device according to <5>, in which the upper electrode of each of the piezoelectric elements of each of the pair of semi-annular actuator parts consists of at least three individual electrode parts separated in a circumferential direction.

<7>

The micromirror device according to any one of <1> to <6>, further comprising a drive circuit that inputs driving signals to the piezoelectric elements of the first actuator and the second actuator.

<8>

The micromirror device according to <7>, in which the drive circuit inputs, to the respective piezoelectric elements of the first actuator and the second actuator, driving signals for driving the micromirror device in a first resonance mode in which the mirror part reciprocates and rotates around the first axis and for driving the micromirror device in a second resonance mode in which the mirror part and the first actuator reciprocate and rotate around the second axis.

<9>

The micromirror device according to any one of <1> to <8>, in which assuming that a resonance frequency in a lowest order mode among resonance modes in which the mirror part reciprocates and rotates around the first axis and the mirror part and the first actuator reciprocate and rotate in opposite phases to each other is Fo, and a resonance frequency in a lowest order mode among resonance modes in which the mirror part reciprocates and rotates around the first axis and the mirror part and the first actuator reciprocate and rotate in a same phase as each other is Fi, $F1=Fo+Fi$, and $F2=Fo-Fi$, where among the resonance frequencies of each of the plurality of resonance modes, a resonance frequency closest to F1 is less than F1−100 Hz or greater than F1+450 Hz, and among the resonance frequencies of each of the plurality of resonance modes, a resonance frequency closest to F2 is less than F2−100 Hz or greater than F2+450 Hz.

According to the present disclosure, it is possible to provide a micromirror device that is capable of sufficiently increasing the ratio of frequencies in the sinusoidal driving in the first axis direction and the second axis direction and that has a small size.

DESCRIPTION OF THE PREFERRED EMBODIMENTS

Hereinafter, specific embodiments of the present disclosure will be described, with reference to the drawings.

Figure 1:
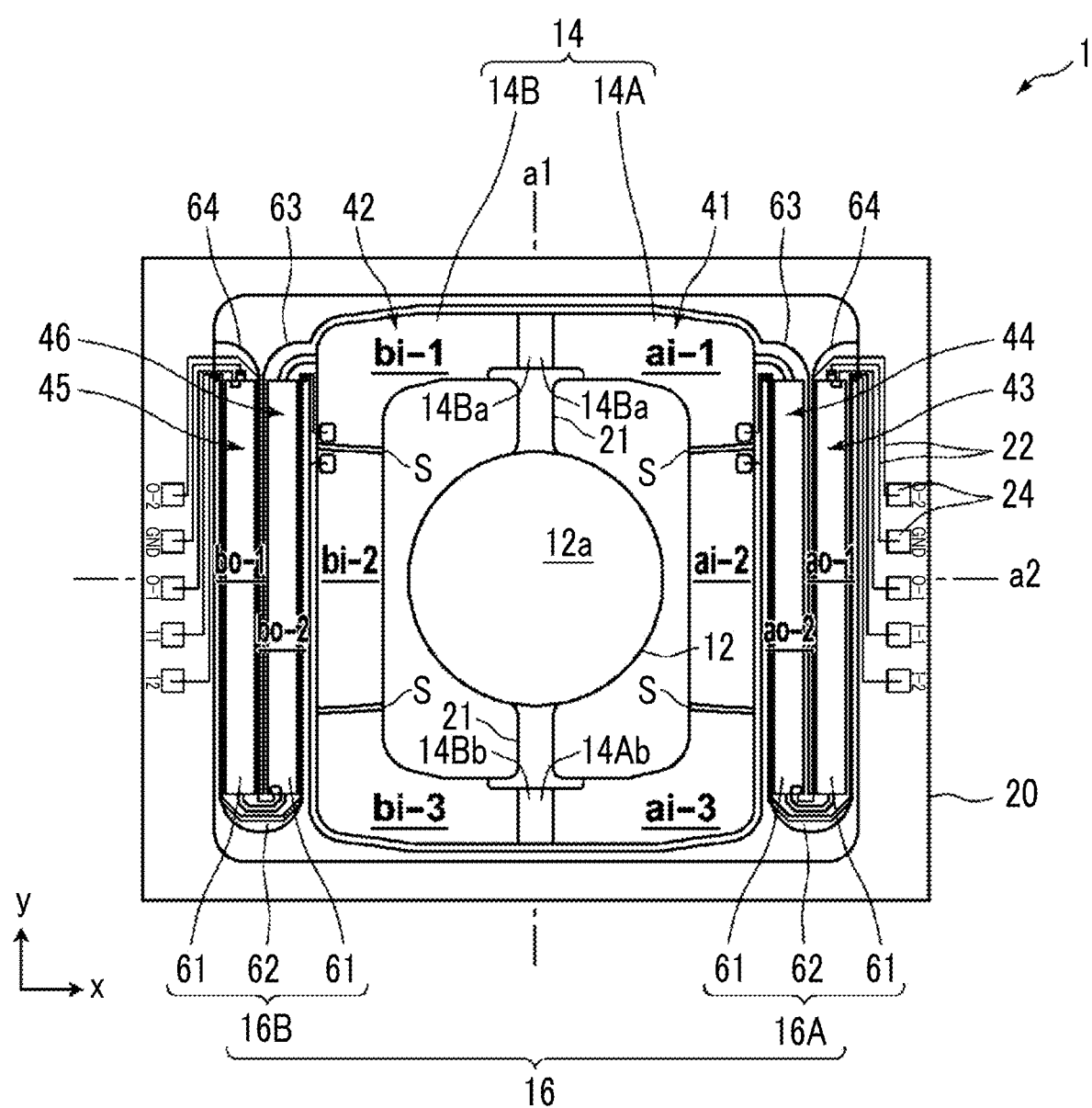
FIG. 1 is a plan view of the micromirror device of an embodiment.
Figure 2:
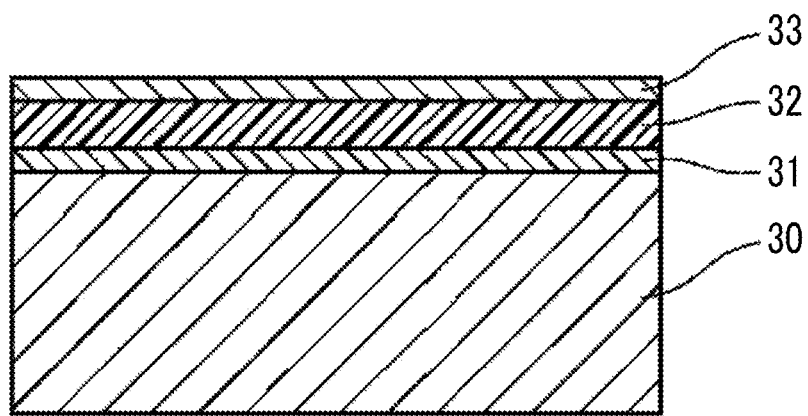
FIG. 2 is a diagram showing a cross-sectional structure of a part of a micromirror device.
Figure 3:
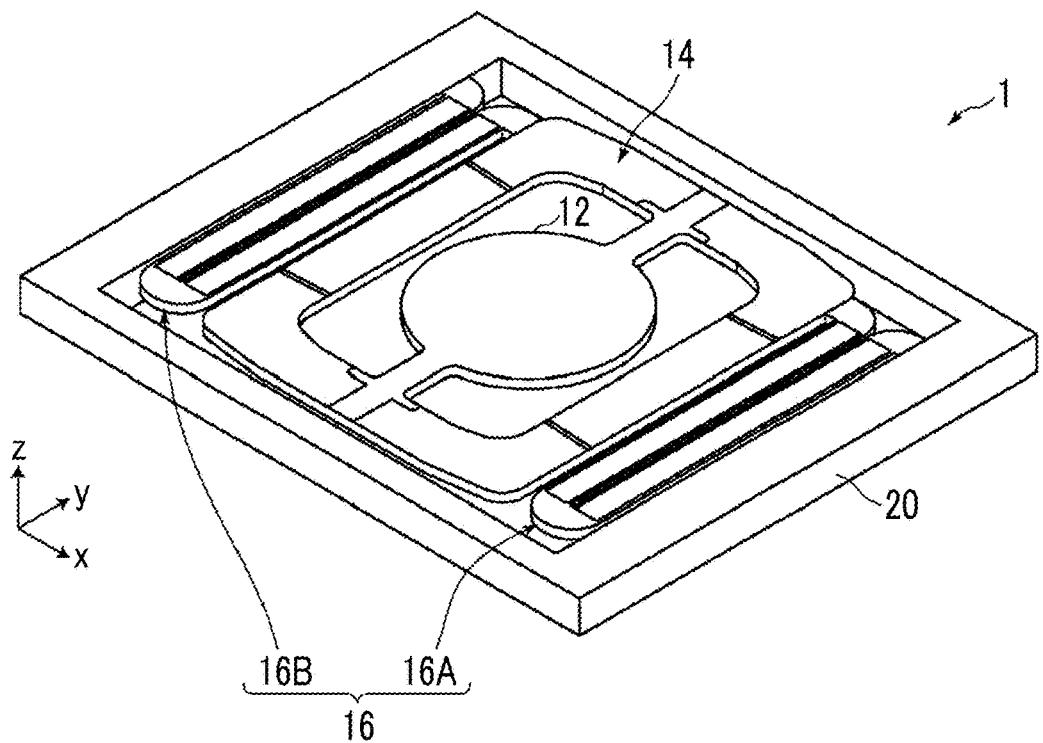
FIG. 3 is a perspective view of the structure of the micromirror device of the embodiment as viewed from the upper surface side.
Figure 4:
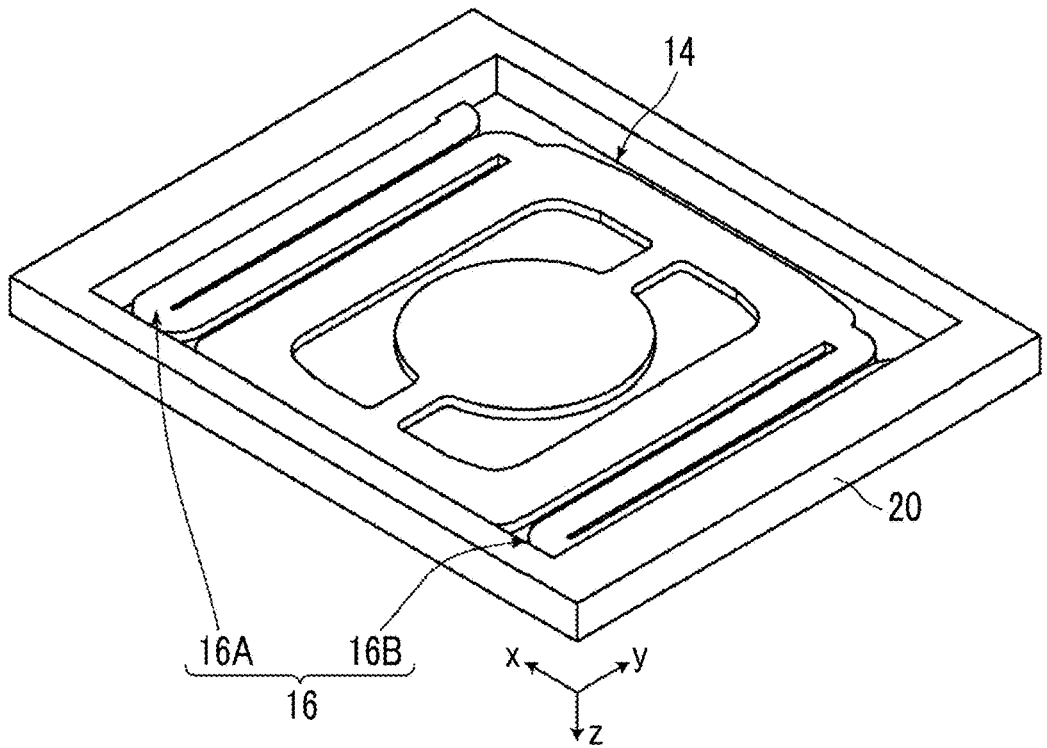
FIG. 4 is a perspective view of the structure of the micromirror device of the embodiment as viewed from the bottom surface side.
Figure 5:
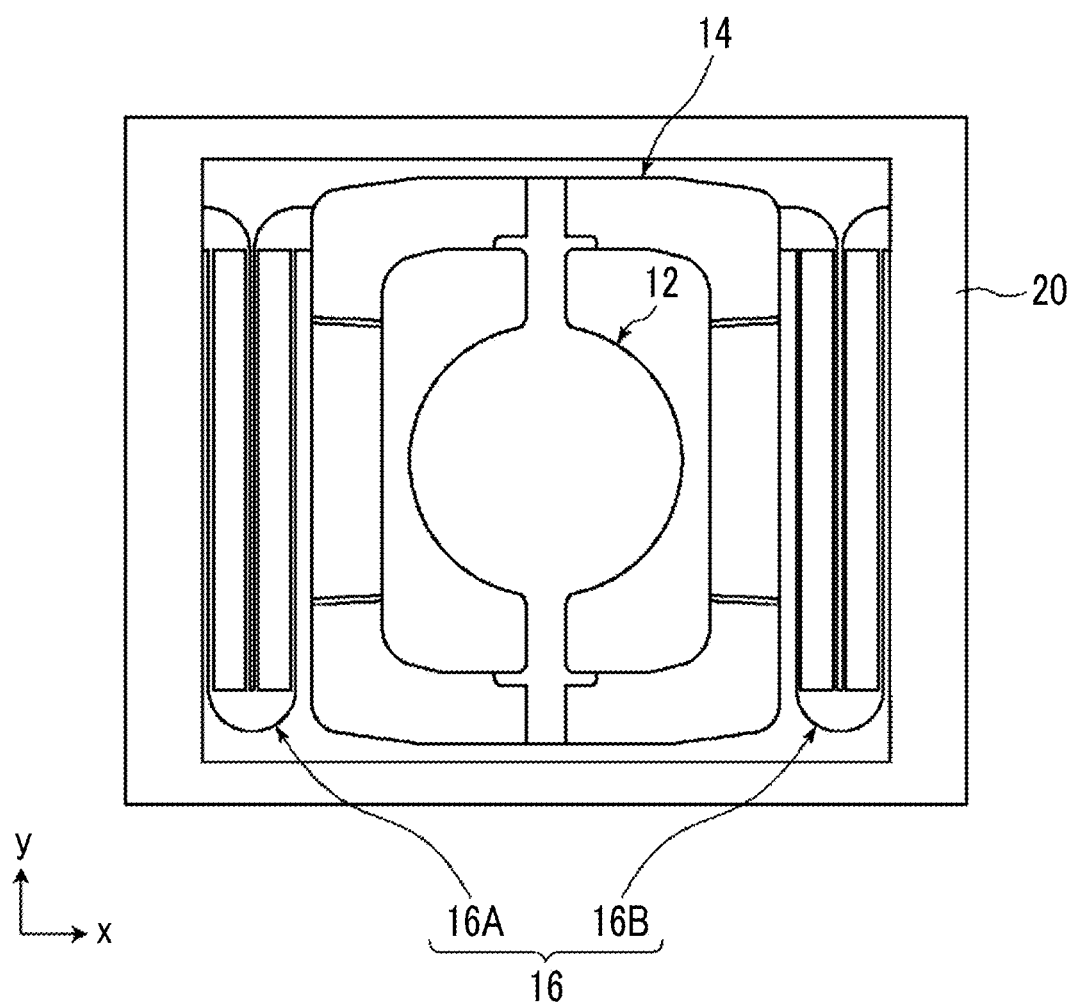
FIG. 5 is a plan view of the structure of the micromirror device of the embodiment.
Figure 6:
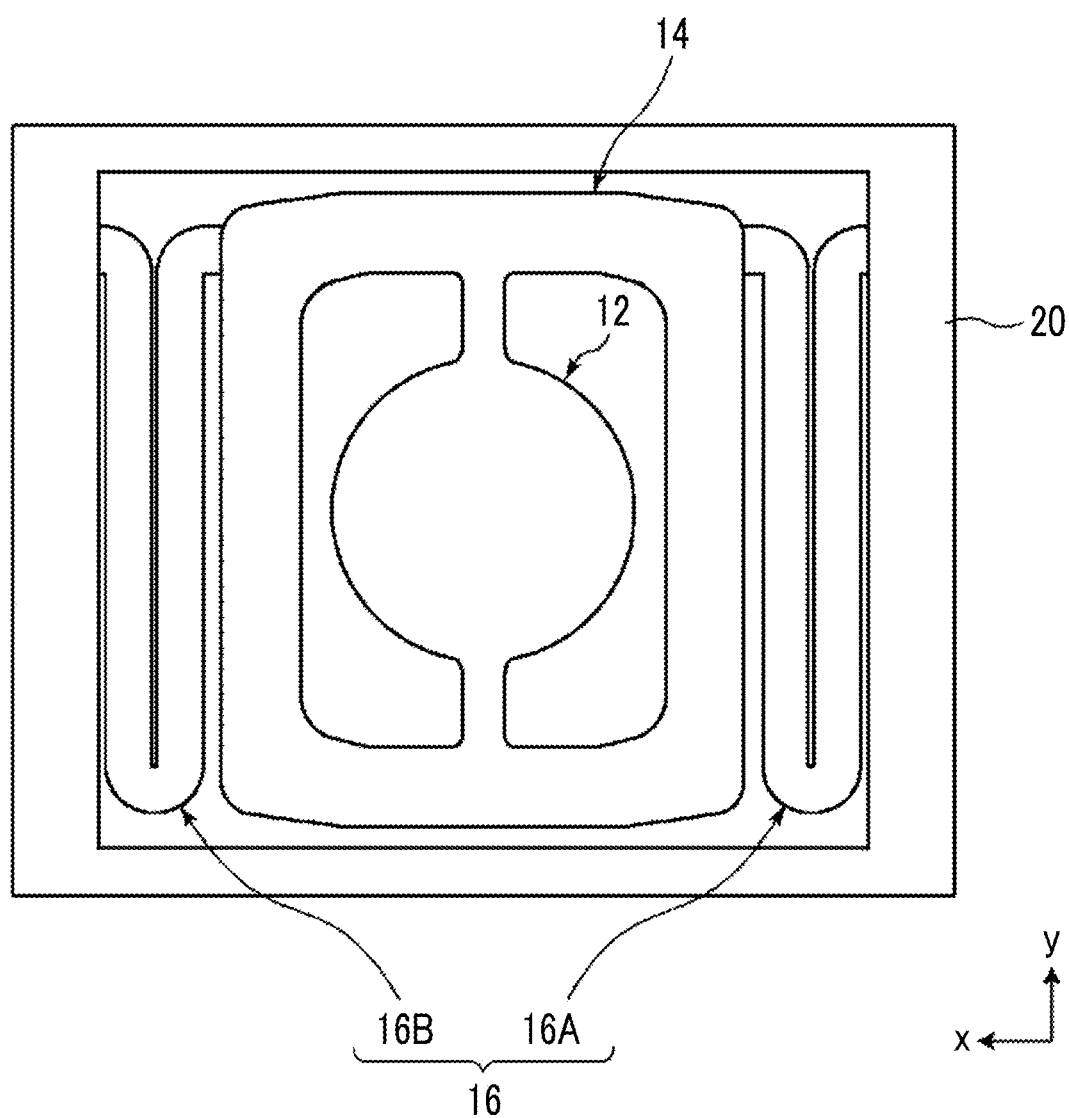
FIG. 6 is a bottom view of the structure of the micromirror device of the embodiment.
Figure 7:
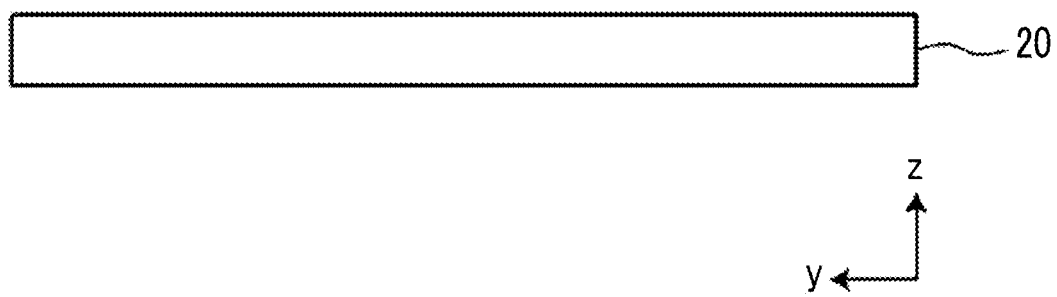
FIG. 7 is a left side view of the structure of the micromirror device of the embodiment.
Figure 7:
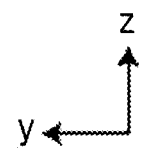
Figure 8:
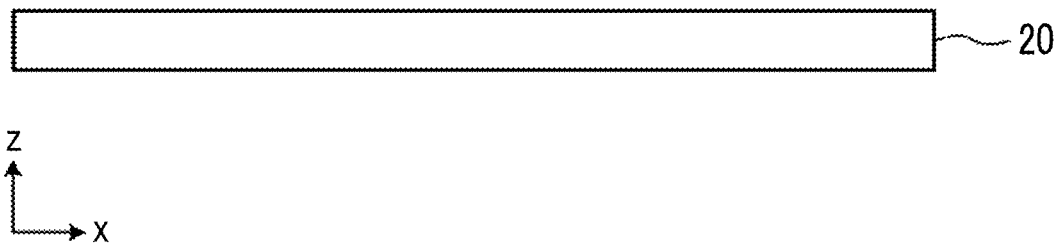
FIG. 8 is a front view of the structure of the micromirror device of the embodiment.
Figure 8:
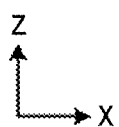

FIG. 1 is a plan view of the micromirror device according to the embodiment. FIG. 2 is a diagram showing a cross-sectional structure of a part of the micromirror device. FIG. 3 is a perspective view of the structure for the micromirror device as viewed from the upper surface side, and shows a state where the micromirror device does not have a wiring structure. FIG. 4 is a perspective view of the structure for the micromirror device of the embodiment as viewed from the bottom surface side. FIG. 5 is a plan view of the structure for the micromirror device of the embodiment, and FIG. 6 is a bottom view of the structure for the micromirror device of the embodiment. FIG. 7 is a left side view of the structure for the micromirror device. It should be noted that the right side view of the structure of the micromirror device is the same as the left side view. FIG. 8 is a front view of the structure of the micromirror device of the embodiment. It should be noted that the rear view of the structure of the micromirror device is the same as the front view.

The micromirror device 1 of the present embodiment comprises a mirror part 12, a first actuator 14 disposed so as to surround the mirror part 12, a connecting part 21 connecting the mirror part 12 and the first actuator 14, a fixing part 20 disposed at the outer periphery of the first actuator 14, and a second actuator 16 disposed between the first actuator 14 and the fixing part 20.

Each size of the micromirror device 1 is generally, for example, about 1 mm to 10 mm in length and width, but may be smaller or larger than the above size, and is not particularly limited. Further, the thickness of the movable part is generally about 5 μm to 0.2 mm, but may be within a range in which the actuator can be manufactured, and is not particularly limited.

The mirror part 12 has a reflecting surface 12a that reflects incident light. The reflecting surface 12a consists of a metal thin film such as Au (gold) and Al (aluminum) provided on one surface of the mirror part 12. The material and film thickness used for the mirror coating for forming the reflecting surface 12a are not particularly limited, and various designs can be made using a known mirror material (a high reflectance material).

FIG. 1 exemplifies a mirror part 12 having an approximately circular reflecting surface 12a and having a plan view shape similar to the reflecting surface 12a. However, the plan view shape of the mirror part 12 and the shape of the reflecting surface 12a may be the same or different. The shapes of the mirror part 12 and the reflecting surface 12a are not particularly limited. Not limited to the circular shape exemplified, there may be various shapes such as an ellipse, a square, a rectangle, and a polygon.

Each of the connecting parts 21 connects the mirror part 12 and the first actuator 14, and rotatably supports the mirror part 12 around the first axis a1. The connecting part 21 is a rod-like member, which extend outward along the first axis a1 from the outer periphery of the mirror part 12 symmetrically with the mirror part 12 interposed therebetween. One end of each of the connecting parts 21 is connected to the outer periphery of the mirror part 12, and the other end of each is connected to the first actuator 14.

Here, the first axis a1 is in a plane including the reflecting surface 12a of the mirror part 12 in a case where the reflecting surface 12a is stationary. The second axis a2 to be described later is an axis that intersects with the first axis a1 in this plane, and is an axis that is orthogonal to the first axis a1 in this description. The first axis a1 and the second axis a2 preferably intersect at the center of the reflecting surface 12a, but the position of the intersection may be deviated from the center.

In each drawing, the normal direction of the reflecting surface 12a in a case where the mirror part 12 is stationary is the z-axis direction, the direction parallel to the first axis a1 is the y-axis direction, and the direction parallel to the second axis a2 is the x-axis direction.

The first actuator 14 includes a pair of semi-annular actuator parts 14A and 14B, respectively, which comprise piezoelectric elements 41 and 42. The pair of semi-annular actuator parts 14A and 14B are disposed so as to surround the mirror part 12. The first connecting part 21 connects the mirror part 12 and one end 14Aa and 14Ba of each of the pair of semi-annular actuator parts, and connects the mirror part 12 and the other end 14Ab and 14Bb of each of the pair of semi-annular actuator parts 14A and 14B, on the first axis a1. That is, the pair of semi-annular actuator parts 14A and 14B are connected on the first axis a1 to form an annular shape as a whole.

Here, the annular shape may be any shape that surrounds the inner region without interruption, and the inner and outer peripheries may not be circular, and is a concept including a rectangular shape or a polygonal shape. In the present example, the outer periphery and the inner periphery of the first actuator 14 each have a substantially rectangular shape.

By bending the semi-annular actuator part 14A and the semi-annular actuator part 14B, which are disposed with the first axis a1 interposed therebetween, in opposite directions, torque can be generated around the first axis a1. Thereby, the mirror part 12 is rotated around the first axis a1.

The second actuator 16 consists of a pair of meandering type actuator parts 16A and 16B disposed between the first actuator 14 and the fixing part 20. The pair of meandering type actuator parts 16A and 16B are disposed symmetrically about the first axis with the first actuator 14 interposed therebetween. The meandering type actuator part 16A has a structure in which two rectangular plate-like parts 61 respectively having piezoelectric elements 43 and 44 are disposed so as to be folded back through a connecting part 62. The meandering type actuator part 16B has a structure in which two rectangular plate-like parts 61 respectively having piezoelectric elements 45 and 46 are disposed so as to be folded back through a connecting part 62. The connecting part 63 provided at one end of the meandering type actuator parts 16A and 16B is connected to the outer periphery of the first actuator 14, and the connecting part 64 provided at the other end is connected to the fixing part 20. The position, in which the connecting part 63 of the meandering type actuator parts 16A and 16B is connected to the first actuator 14, may be the outer periphery of each of the semi-annular actuator parts 14A and 14B, and is not limited to the mode shown in FIG. 1. Similarly, the position, in which the connecting part 64 of the meandering type actuator parts 16A and 16B is connected to the fixing part 20, may be the inner periphery of the fixing part 20, and is not limited to the mode shown in FIG. 1. The second actuator 16 also functions as a connecting part for connecting the first actuator 14 and the fixing part 20.

Each of the rectangular plate-like parts 61 of the meandering type actuator parts 16A and 16B functions as a piezoelectric cantilever. In order to generate torque around the second axis, adjacent rectangular plate-like parts 61 may be bent in opposite directions. Thereby, tilt angles generated at the ends of the respective rectangular plate-like parts 61 are accumulated, and the sum thereof is a tilt of the first actuator 14 (=tilt of the mirror part 12). Therefore, a voltage is applied to the piezoelectric elements 43 and 44 and the piezoelectric elements 45 and 46 of the adjacent rectangular plate-like parts 61 so that stress in the opposite direction is generated. Specifically, the phase of the voltage waveform applied thereto may be shifted by 180°. In such a manner, the second actuator 16 is able to generate rotational torque in the first actuator 14 and the mirror part 12.

In the meandering type actuator parts 16A and 16B, the number of rectangular plate-like parts 61 may be three or more, and each of them may be disposed so as to be folded back through the connecting part 62. Further, here, the meandering type actuator parts 16A and 16B may comprise only one rectangular plate-like part 61. In a case where there is only one rectangular plate-like part 61, the connecting part provided at one end thereof is connected to the outer periphery of the semi-annular actuator parts 14A and 14B, and the connecting part provided at the other end is connected to the inner periphery of the fixing part 20. As a result, the two connecting parts and the rectangular plate-like part 61 form a meandering shape (meandering shape) as a whole. However, it is preferable that one meandering type actuator part 16A and 16B includes two or more rectangular plate-like parts 61, and it is preferable that the number of rectangular plate-like parts 61 is an even number from the viewpoint of suppressing warping in a case where the device is stationary.

The fixing part 20 supports the second actuator 16, and supports the first actuator 14 and the mirror part 12 through the second actuator 16. The fixing part 20 is provided with a wiring 22, an electrode terminal 24, and the like, and may be further provided with an electronic circuit which is not shown.

In the present example, the fixing part 20 is a frame member that surrounds the second actuator 16. The fixing part 20 is not limited to the frame member, and may be composed of two members including a first fixing part connected to one meandering type actuator part 16A and a second fixing part connected to the other meandering type actuator part 16B.

the first actuator 14 applies a rotational torque around the first axis a1 to the mirror part 12 and the second actuator 16 applies a rotational torque around the second axis a2 intersecting with the first axis a1 to the first actuator 14 so as to two-dimensionally rotationally drive the mirror part 12 around the first axis a1 and the second axis a2. By driving the mirror part 12 in two-dimensional rotation, the micromirror device 1 reflects the incident light on the reflecting surface 12a of the mirror part 12. Thereby, it is possible to perform two-dimensional scanning.

The micromirror device 1 is able to oscillate the mirror part 12 at high speed around the first axis a1 with the structure of the first actuator 14 surrounding the mirror part 12 and the connecting part 21 connecting the mirror part 12 and the first actuator 14. The reason for this is that the width of the connecting part 21 is wide, the length is short, the rigidity is increased, and a high resonance frequency can be obtained. On the other hand, the meandering type actuator parts 16A and 16B of the second actuator 16 function as long connecting parts that connect the first actuator 14 and the fixing part 20, and can be softened like a spring. Therefore, the first actuator 14 and the mirror part 12 can be oscillated at a low speed around the second axis a2.

Accordingly, in the present micromirror device 1, it is possible to increase the ratio of frequencies around the first axis and the second axis, that is, the ratio of frequencies of the vertical axis and the horizontal axis direction. For example, the ratio of frequencies can be set to 15 or more. Although both the frequency in the vertical axis direction and the frequency in the horizontal axis direction are increased, in a case where the ratio of frequencies thereof is close to 1, the scanning lines are diagonal, and the vertical and horizontal positions of the scan spots change in a complicated manner. Therefore, it is extremely difficult to perform control for narrowing the interval and increasing the resolution. On the other hand, by increasing the ratio of the both frequencies, the number of scanning lines in the horizontal direction increases and the scanning lines are substantially horizontal. Thereby, it is easy to perform control for increasing the number of scanning lines, and it is possible to display a high-definition image.

As mentioned above, the resonance frequency is defined by the ratio of the moment of inertia and the rigidity. In order to increase the frequency on the high speed side, it is necessary to have a high rigid structure. On the other hand, in order to decrease the frequency on the low speed side, it is necessary to make the rigidity extremely small. By providing the meandering type actuator parts 16A and 16B, even at the thickness necessary to increase the frequency on the high speed side, the rigidity can be sufficiently reduced without increasing the element size. As a result, it is possible to generate low-speed oscillation. As described above, the overall size of the micromirror device 1 can be suppressed. Therefore, the overall chip size can be reduced and miniaturized even in a case where the size of the mirror part 12 is increased. In a case where the size of the mirror part 12 is large, the beam diameter of the incident light can be increased, the beam spread due to interference can be suppressed, and the projection surface can be narrowed down sufficiently. Therefore, it is possible to achieve a higher-definition image display.

In the micromirror device 1 of the present example, the mirror part 12, the first actuator 14, the second actuator 16, the fixing part 20, and the connecting parts 21 are disposed to have a line-symmetrical structure in the first axis a1. With such a symmetrical structure, rotational torque can be efficiently applied to the central mirror part 12.

The micromirror device 1 can be manufactured as a structure, in which elements such as the mirror part 12, the first actuator 14, the second actuator 16, the fixing part 20, and the connecting parts 21 are integrally formed, for example, by being processed from a silicon substrate through a semiconductor manufacturing technology.

The fixing part 20 is thicker than the mirror part 12, the first actuator 14, the second actuator 16, and the connecting part 21 (refer to FIGS. 3 and 4). That is, the thicknesses of the mirror part 12, the first actuator 14, the second actuator 16, and the connecting parts 21 are formed to be less than the thickness (thickness in the z axis direction) of the fixing part 20. Thereby, the first actuator 14, the second actuator 16, and the connecting parts 21 each have a structure which tends to cause deformation (bending deformation or twisting deformation). The substrate part is referred to as a structure for a micromirror device. The substrate part excludes the reflecting surface, the piezoelectric film, the electrodes, the wiring, and the like in the mirror part 12, the first actuator 14, the second actuator 16, and the fixing part 20. Further, the part of this structure excluding the fixing part 20 is the body part in the structure. The basic performance of the micromirror device depends on the shape of the body part and does not depend on the shape of the fixing part 20.

Piezoelectric elements 41 to 46 provided in the pair of semi-annular actuator parts 14A and 14B of the first actuator 14 and the pair of meandering type actuator parts 16A and 16B of the second actuator 16 have a laminated structure in which the lower electrode 31, the piezoelectric film 32, and the upper electrode 33 are laminated on the oscillation plate 30 in this order (refer to FIG. 2). It should be noted that, in FIG. 2, for the sake of easy visibility, the film thickness ratio is different from the actual film thickness ratio. The "upper" and "lower" of the upper electrode 33 and the lower electrode 31 do not mean the top and bottom. Among the pair of electrodes sandwiching the piezoelectric film 32, the electrode provided on the oscillation plate side is merely referred to as the lower electrode, and the electrode disposed so as to face the lower electrode with the piezoelectric film interposed therebetween is merely referred to as the upper electrode.

The first actuator 14 and the second actuator 16 generates the driving force by being bent and displaced through the deformation of the piezoelectric film 32 due to the application of a predetermined voltage to the piezoelectric elements 41 to 46.

The upper electrode 33 of the piezoelectric element 41 in one semi-annular actuator part 14A of the first actuator 14 consists of three individual electrode parts ai-1, ai-2, and ai-3 disposed in order from one end 14Aa to the other end 14Ab. The individual electrode parts ai-1 to ai-3 are formed separately from each other. Similarly, the upper electrode 33 of the piezoelectric element 42 in the other semi-annular actuator part 14B of the first actuator 14 consists of three individual electrode parts bi-1, bi-2, and bi-3 disposed in order from one end 14Ba to the other end 14Bb. The individual electrode parts bi-1 to bi-3 are formed separately from each other.

One of piezoelectric elements 43 to 46 is provided in each of the rectangular plate-like parts 61 of the meandering type actuator parts 16A and 16B of the second actuator 16. The upper electrodes 33 of the piezoelectric elements 43 and 44 of the two rectangular plate-like parts 61 of one meandering type actuator part 16A are represented by ao-1 and ao-2, respectively, and the upper electrodes 33 of the piezoelectric elements 45 and 46 of the two rectangular plate-like parts 61 of the other meandering type actuator part 16B are represented by bo-1 and bo-2, respectively (refer to FIG. 1).

In a case where the mirror part 12 is driven in the first resonance mode in which the mirror part 12 reciprocates and rotates around the first axis a1, a plurality of stress inversion regions S occur in which positive and negative, of a principal stress component having a maximum absolute value generated in the in-plane direction of the piezoelectric films 32 of the piezoelectric elements 41 and 42 are inverted. The individual electrode parts ai-1 to ai-3 and bi-1 to bi-3 are disposed to be separated by the stress inversion regions S. Here, the reciprocation rotation is a oscillation in which the mirror part 12 alternately tilts clockwise and counterclockwise around the first axis as a center, relative to the stationary state. By forming the upper electrode 33 separately into a plurality of individual electrode parts ai-1 to ai-3 and bi-1 to bi-3, it is possible to independently control the voltage for each piezoelectric part defined by each individual electrode part. The piezoelectric part is composed of each individual electrode part, an opposing lower electrode 31, and a piezoelectric film 32 interposed between each individual electrode part and the lower electrode 31. Each individual electrode part and the lower electrode 31 are connected to a drive circuit through the wiring 22 and the electrode terminal 24. Each principal stress and each stress inversion region will be described later.

Figure 9:
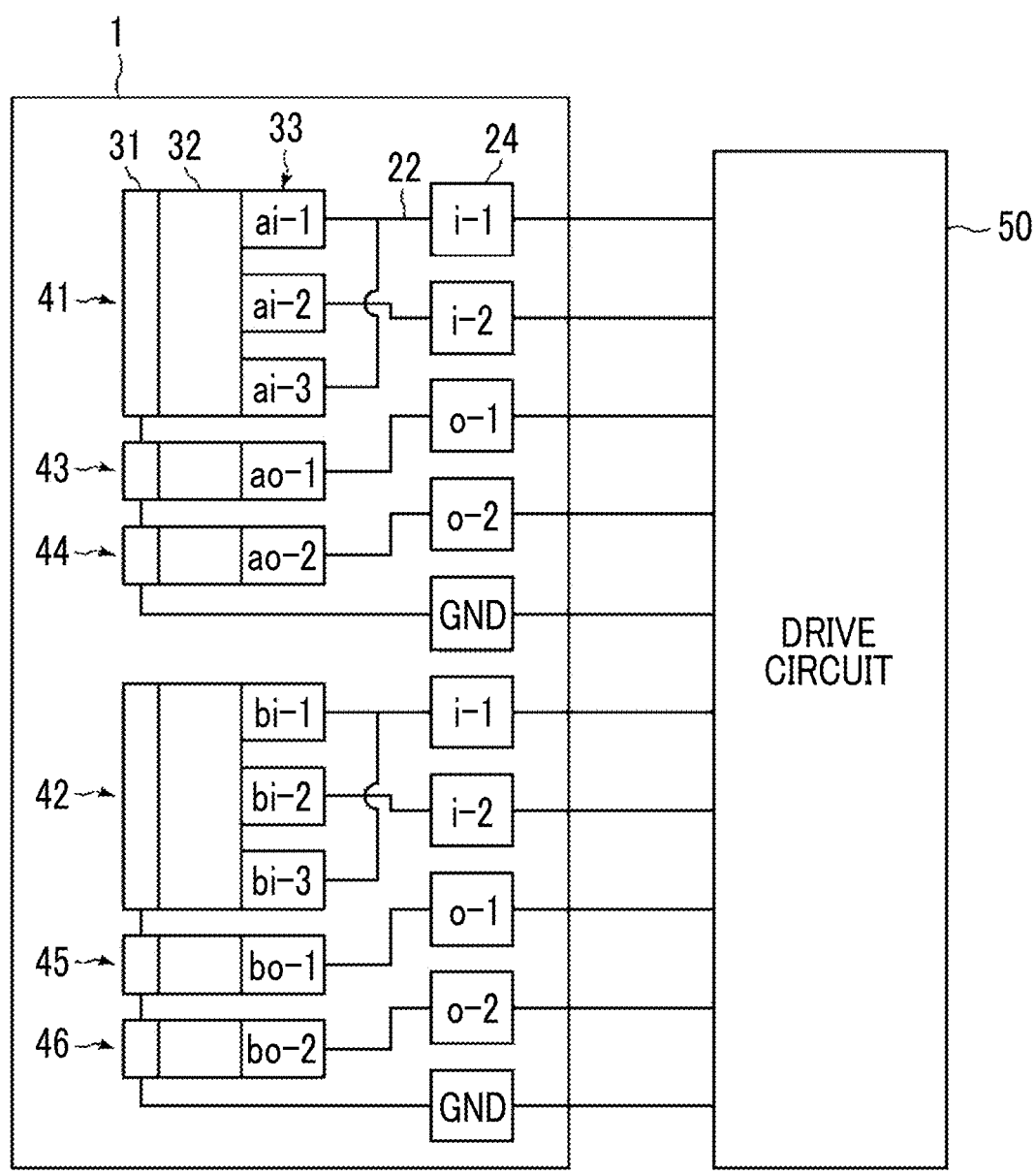
FIG. 9 is a diagram schematically showing connection with a drive circuit of the micromirror device of the embodiment.

FIG. 9 is a block diagram showing an electrical wiring structure between the drive circuit 50 and each of the piezoelectric elements 41 to 46 of the micromirror device 1 in the present example.

Each of the piezoelectric elements 41 to 46 includes the lower electrode 31, the piezoelectric film 32, and the upper electrode 33. The individual electrode parts ai-1 and ai-3 of the piezoelectric element 41 are connected to perform the same driving and are connected to a common electrode terminal 24. Similarly, the individual electrode parts bi-1 and bi-3 of the piezoelectric element 42 are connected to perform the same driving and are connected to a common electrode terminal 24. The lower electrodes 31 of the piezoelectric elements 41, 43 and 44 are connected on the structure and are connected to the ground electrode terminal GND. Similarly, the lower electrodes 31 of the piezoelectric elements 42, 45 and 46 are connected on the structure and are connected to the ground electrode terminal GND.

In the present embodiment, the piezoelectric film 32 and the lower electrode 31 are formed as a film common to a plurality of piezoelectric parts. However, the piezoelectric film 32 or the piezoelectric film 32 and the lower electrode 31 may be separated for each individual electrode part of the upper electrode 33.

Figure 10:
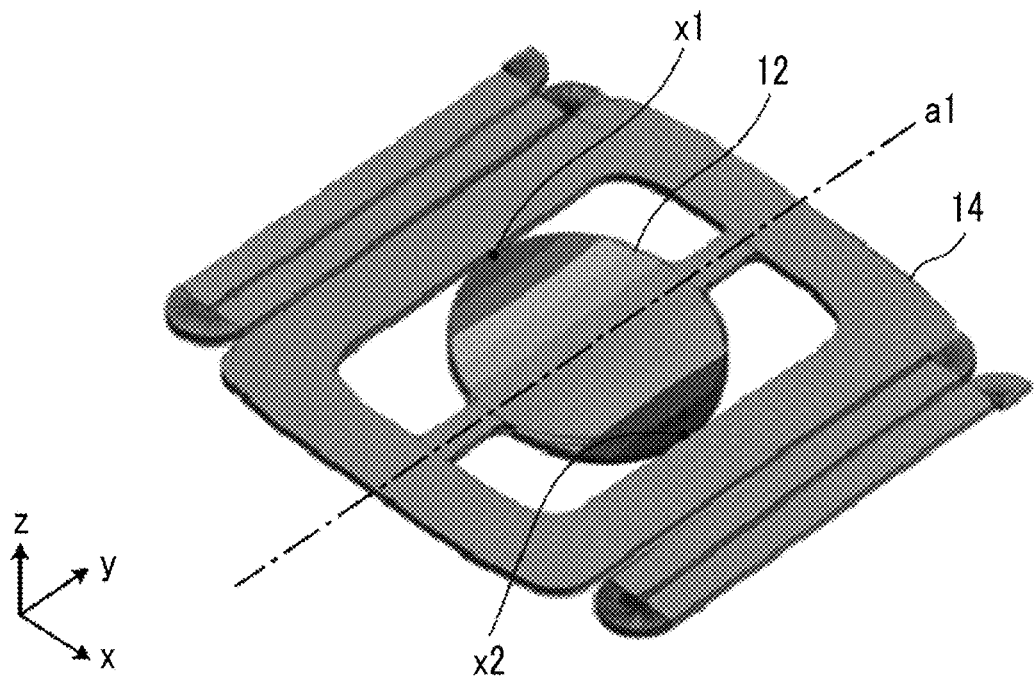
FIG. 10 is a simulation diagram of shape displacement in the first resonance mode accompanied by reciprocation rotation of the mirror part around the first axis in the micromirror device of the embodiment.

FIG. 10 is a simulation diagram showing a state where the mirror part 12 reciprocates and rotates around the first axis a1 in the first resonance mode, and shows a state where one end x1 of the mirror part 12 in the x-axis direction around the first axis a1 as a center is tilted and displaced in the +z-axis direction and the other end x2 thereof in the x-axis direction is tilted and displaced in the −z-axis direction. In FIG. 10, the shade of color indicates the amount of displacement. The darker the color, the larger the amount of displacement.

In a case where the mirror part 12 reciprocates and rotates around the first axis a1 in the first resonance mode and is tilted and displaced as shown in FIG. 10, the first actuator 14 bends and deforms. Then, tensile stress regions and compressive stress regions are generated. In each tensile stress region, a stress in the tensile direction (hereinafter referred to as a tensile stress) σt is applied to the piezoelectric films 32. In each compressive stress region, a stress in the compression direction (hereinafter referred to as a compressive stress) σC is applied thereto.

Whether each part of the piezoelectric film 32 is "compressive stress" or "tensile stress" is defined by the direction in which the absolute value is larger (the direction of the principal stress component having the maximum absolute value) of two principal stresses in a plane substantially orthogonal to the film thickness direction of the piezoelectric film which are selected from three principal stress vectors orthogonal to each other. In a case where the film thickness direction is taken on the z-axis, the two principal stresses in the plane substantially orthogonal to the film thickness direction are the stresses generated in the x-y plane. As the notation method of the stress direction, the vector in the outward direction is defined as the tensile direction, and the vector in the inward direction is defined as the compression direction.

The reason for defining in such a manner is that, in a piezoelectric MEMS device, the dimensions of the actuator part are generally planar, and the stress in the film thickness direction can be regarded as almost 0. The phrase "dimensions are planar" means that the height is sufficiently smaller than the dimensions in the plane direction. The plane direction of the above-mentioned "x-y plane" corresponds to the "in-plane direction orthogonal to the film thickness direction of the piezoelectric film". The stress is defined as follows. The tensile stress σt applying a force in the direction in which the member is pulled is positive, and the compressive stress σc applying a force in the direction in which the member is compressed is negative. That is, the region where the principal stress component having the maximum absolute value is positive means a region where the tensile stress is dominant, and the region where the principal stress component having the maximum absolute value is negative means a region where the compressive stress is dominant. Further, the term "stress inversion region in which the positive and negative, of the principal stress component having the maximum absolute value are inverted" means a region including the boundary between the tensile stress region and the compressive stress region, and a region that the stress changes from the tensile stress to the compressive stress or from the compressive stress to the tensile stress.

At the boundary between the compressive stress region c1 and the tensile stress region t1, the stress inversion region is present, which is a region where the direction of stress gradually changes, that is, a region where the positive and negative, of the principal stress component having the maximum absolute value are inverted. The individual electrode parts ai-1 to ai-3 and bi-1 to bi-3 of the upper electrodes 33 of the piezoelectric elements 41 and 42 described above are formed so as to correspond to the division of regions of the piezoelectric films having different stress directions.

The stress distribution during operation using resonance mode oscillation (resonance drive) can be analyzed by parameters such as device dimensions, Young's modulus of material, and device shape given using the known finite element method software through a mode analysis method. In design of the device, stress distribution in the piezoelectric film in a case of driving in the resonance mode is analyzed, and the upper electrodes are divided into individual electrode parts, in accordance with the division of the compressive stress region and the tensile stress region in stress distribution, based on the analysis result. Each piezoelectric part is defined by each individual electrode part.

In the first actuator 14, by disposing the piezoelectric parts in accordance with the parts having different generated stress directions, an appropriate driving signal can be input to each of them. Therefore, the piezoelectric force can be efficiently converted into a displacement.

Figure 11:
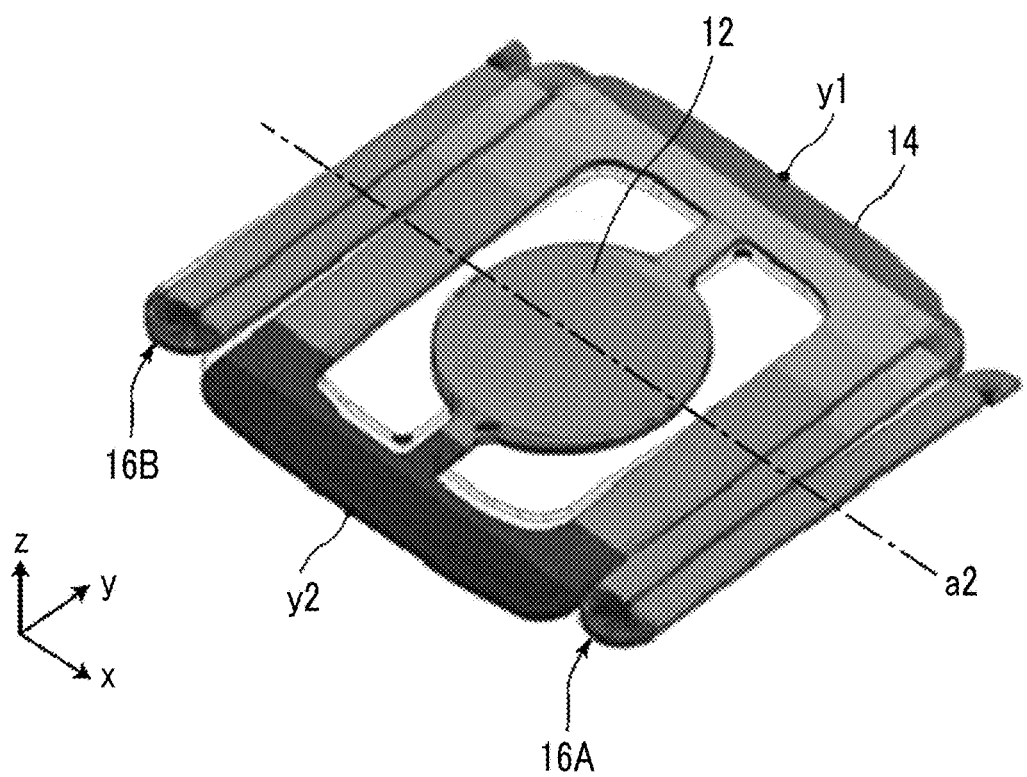
FIG. 11 is a simulation diagram of shape displacement in the second resonance mode accompanied by reciprocation rotation of the mirror part around the second axis in the micromirror device of the embodiment.

FIG. 11 is a simulation diagram showing a state where the mirror part 12 reciprocates and rotates around the second axis a2 in the second resonance mode, and shows a state where one end y1 of the mirror part 12 in the y-axis direction of the first actuator 14 around the second axis a2 as a center is tilted and displaced in the +z-axis direction and the other end y2 thereof in the y-axis direction is tilted and displaced in the −z-axis direction. In FIG. 11, the shade of color indicates the amount of displacement.

As described above, in order to bend the adjacent rectangular plate-like parts 61 in different directions, the meandering type actuator part 16A inputs driving signal waveforms having opposite phases to the piezoelectric elements 43 and 44, respectively. In order to bend the adjacent rectangular plate-like parts 61 in different directions, the meandering type actuator part 16B inputs the driving signal waveforms having opposite phases to the piezoelectric elements 45 and 46, respectively.

Driving power for driving in each of the first resonance mode and the second resonance mode is supplied from the drive circuit 50 to the piezoelectric elements 41 and 42 of the first actuator 14 and the piezoelectric elements 43 to 46 of the second actuator 16. As the driving signal supplied to each of the first actuator 14 and the second actuator 16, an AC signal and a pulse waveform signal having a frequency that excites resonance can be used. Specific driving signals will be described below together with the driving method.

The drive circuit 50 inputs a first driving signal for driving the first resonance mode to each of the plurality of piezoelectric parts of the piezoelectric elements 41 and 42 of the first actuator 14, and inputs a second driving signal for driving the second resonance mode to each of the plurality of piezoelectric elements 43 to 46 in the second actuator 16.

The first driving signal is a signal which includes driving voltage waveforms having opposite phases to each other. The signal is for giving the driving voltage waveform of one of the phases to the piezoelectric part located in the region, in which the principal stress component having the maximum absolute value at the moment in a case where the oscillation amplitude is maximized in a case of driving in the first resonance mode is positive, and for giving the driving voltage waveform of the other phase to the piezoelectric part located in the region in which the principal stress component having the maximum absolute value is negative at the above moment.

The second driving signal is a signal which includes driving voltage waveforms having opposite phases to each other, and which gives a driving voltage waveform of one of the phases to the piezoelectric element of the rectangular plate-like part provided in the rectangular plate-like parts adjacent to each other and gives a driving voltage waveform of the other phase to the piezoelectric element of the other rectangular plate-like part.

Accordingly, the drive circuit 50 applies, as the first driving signals for driving the first actuator 14, driving signal waveforms having the same phase to the piezoelectric parts located in the regions in which the principal stress component having the maximum absolute value at the moment in a case where the drive amplitude is maximized in a case of driving in the first resonance mode has the same direction (the same sign). That is, a driving signal waveform having the same phase is applied to the piezoelectric parts located in the compressive stress regions, and a driving signal waveform having the same phase is applied to the piezoelectric parts located in the tensile stress regions. Then, the drive circuit 50 applies, as the first driving signals, driving signal waveforms having the opposite phases to the piezoelectric parts located in the regions in which the principal stress component having the maximum absolute value at the moment in a case where the drive amplitude is maximized in a case of driving in the first resonance mode has the different directions (the different signs). That is, driving signal waveforms having opposite phases are applied to the compressive stress regions and the tensile stress regions. The amplitudes of the driving signal waveforms having the same phase may be the same between the piezoelectric parts, or may be different between the piezoelectric parts.

Further, the drive circuit 50 applies, as the second driving signal for driving the second actuator 16, driving signal waveforms having opposite phases to each other to the piezoelectric elements 43 and 44 of the adjacent rectangular plate-like parts, and applies driving signal waveforms having opposite phases to each other to the piezoelectric elements 45 and 46 in a similar manner.

In such a manner, the first resonance mode and the second resonance mode can be excited at the same time by applying the first driving signal for the first resonance mode to the first actuator 14 and the second driving signal for the second resonance mode to the second actuator 16. In a case of driving the first actuator 14, a positive voltage is applied to the piezoelectric parts located in the regions where the principal stress component having the maximum absolute value in the principal stresses generated in the respective piezoelectric films 32 at each moment of reciprocation rotation of the mirror part 12 is positive, and a negative voltage is applied to the piezoelectric parts located in the regions where the principal stress component having the maximum absolute value is negative. By applying a positive or negative voltage in accordance with the positive or negative of the strain, the piezoelectric force can be converted into the displacement very efficiently. Therefore, it is possible to significantly reduce power consumption.

Figure 12:
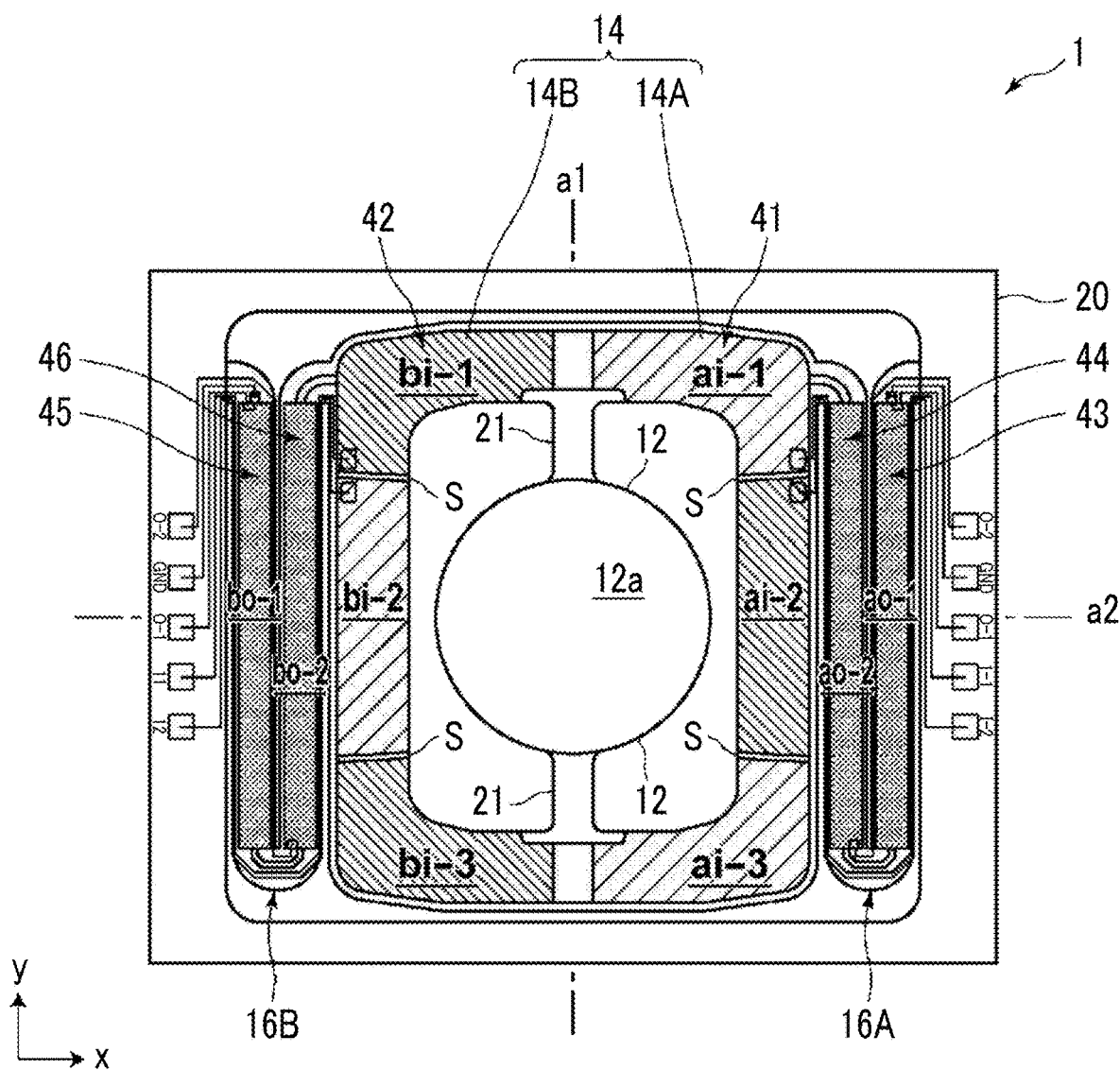
FIG. 12 is a diagram for explaining voltage application in a case of driving around the first axis.
Figure 13:
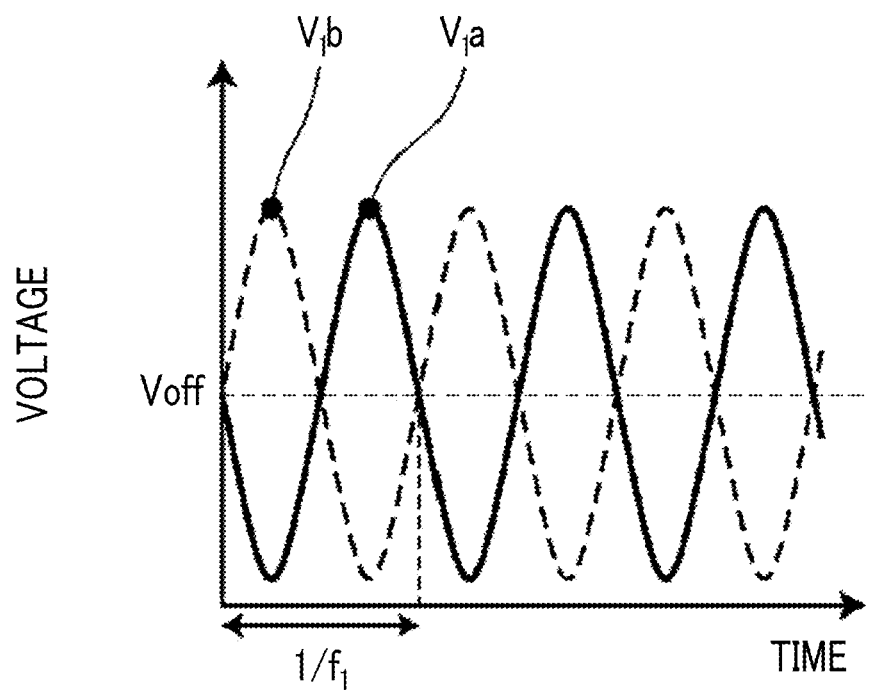
FIG. 13 is a diagram showing an applied driving signal (voltage waveform) in a case of driving around the first axis.
Figure 14:
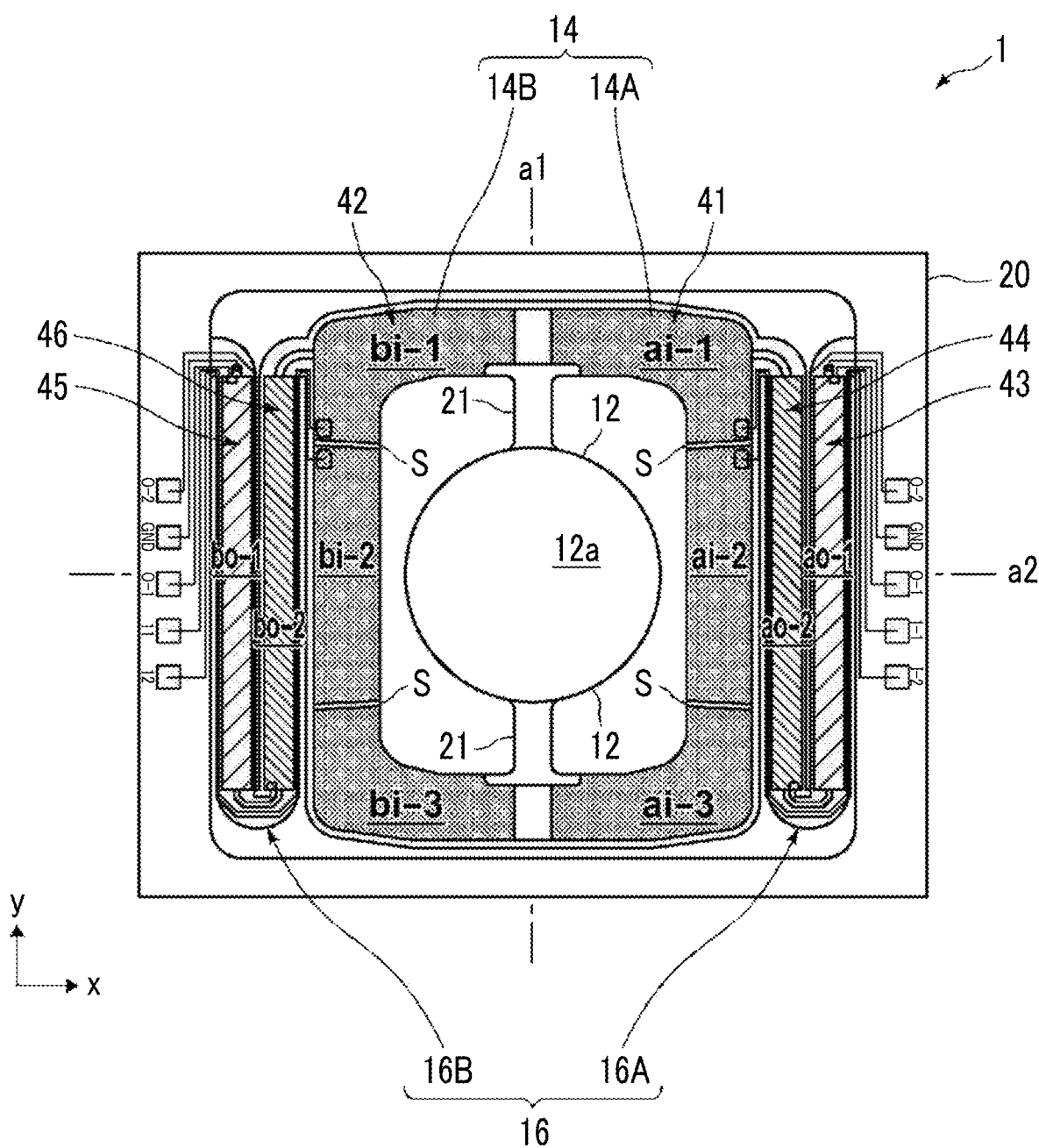
FIG. 14 is a diagram for explaining voltage application in a case of driving around the second axis.
Figure 15:
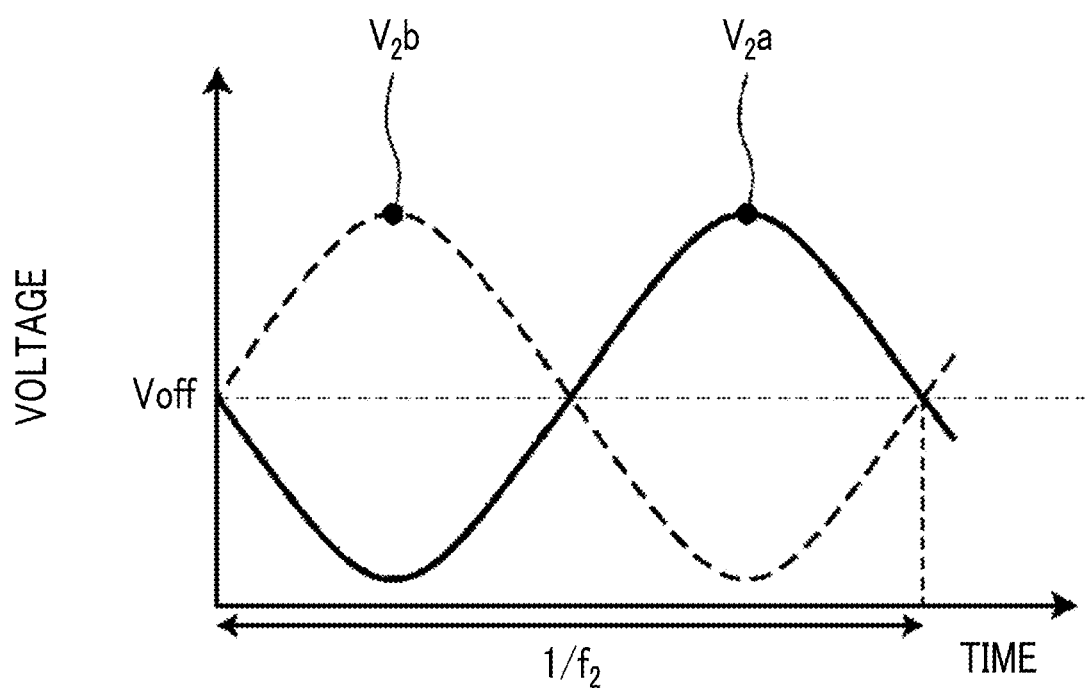
FIG. 15 is a diagram showing an applied driving signal (voltage waveform) in a case of driving around the second axis.

An example of the driving method will be specifically described with reference to FIGS. 12 to 15. FIG. 12 is a diagram showing a piezoelectric part group to which a driving signal having the same phase is input in a case where the first resonance mode is excited. FIG. 13 shows an example of a driving signal which is input to each piezoelectric part group. FIG. 14 is a diagram showing a piezoelectric part group to which a driving signal having the same phase is input in a case where the second resonance mode is excited. FIG. 15 shows a driving signal which is input to each piezoelectric part group.

In FIG. 12, the individual electrode parts of the piezoelectric parts of the first group to which driving signals having the same phase are input in a case where the first resonance mode is excited are indicated by diagonal right downward lines. Further, the individual electrode parts of the piezoelectric parts of the second group to which the driving signal having the opposite phase to that of the first group is input are indicated by diagonal right upward lines.

The individual electrode parts ai-2, bi-1, and bi-3 of the first group correspond to the above-mentioned compressive stress region c1, and the first driving signal $V_1a$ for the first resonance mode having the same phase shown in FIG. 13 is input thereto. The individual electrode parts ai-1, ai-1, and bi-2 of the second group correspond to the above-mentioned tensile stress regions t1, and the first driving signal $V_1b$ for the resonance mode having the same phase is input to the individual electrode parts. As shown in FIG. 13, the driving signal $V_1a$ applied to the piezoelectric parts of the first group and the driving signal $V_1b$ applied to the piezoelectric parts of the second group have the same first frequency $f_1$ and are signals having opposite phases to each other (phase difference 180°). By applying such a driving signal, a distortion that tilts the first actuator 14 around the first axis a1 is generated, and a rotational torque around the first axis a1 is given to the mirror part 12.

The first driving signals $V_1a$ and $V_1b$ are represented as follows, respectively.

$$V_1a = \alpha_1 V_1 \sin(2\pi f_1 t + \pi)$$

$$V_1 = \alpha_1 V_1 \sin 2\pi f_1 t$$

In the above expression, $\alpha_1 V_1$ is the voltage amplitude and t is the time. The offset voltage is not considered in the expression. $V_1$ is a basic voltage amplitude value of the first driving signal, and $\alpha_1$ is a voltage amplitude correction coefficient for the first driving signal. The voltage amplitude given to each individual electrode part may be the same or different. That is, the value of $\alpha_1$ may be different for each piezoelectric part. The voltage amplitude may be set in accordance with the magnitude of the stress generated in each individual electrode part. For example, the larger the magnitude of the stress generated in the individual electrode part, the larger the voltage amplitude.

In a case of collecting and generalizing the first driving signals $V_1a$ and $V_1b$, an expression can be represented as $V_1 = \alpha_1 V_1 \sin(2\pi f_1 t + \beta_1 \pi)$.

Here, $\beta_1$ is a phase correction coefficient for the first driving signal, and is 1 In such a case of $V_1a$ having the first phase and is 0 In such a case of $V_1b$ having the second phase, which is the opposite phase to the first phase.

In FIG. 14, the upper electrodes of the piezoelectric parts (piezoelectric elements) of the third group to which driving signals having the same phase are input in a case where the second resonance mode is excited are indicated by diagonal right downward lines. Further, the upper electrodes of the piezoelectric parts (piezoelectric elements) of the fourth group to which the driving signal having the opposite phase to that of the third group is input are indicated by diagonal right upward lines.

The second driving signal $V_2a$ for the second resonance mode having the same phase shown in FIG. 15 is input to the upper electrodes ao-2 and bo-2 of the third group. Then, the second driving signal $V_2b$ for the second resonance mode having the same phase is input to the upper electrodes ao-1 and bo-1 of the fourth group. As shown in FIG. 15, the second driving signals $V_2a$ and $V_2b$ have the same second frequency $f_2$ and are signals having opposite phases to each other (phase difference 180°). By applying such a driving signal, a distortion that tilts the first actuator 14 around the second axis a2 is generated. As a result, a rotational torque around the second axis a2 is given to the mirror part 12.

The second driving signals $V_2a$ and $V_2b$ are represented as follows, respectively.

$$V_2a = \alpha_2 V_2 \sin(2\pi f_2 t + \pi)$$

$$V_2b = \alpha_2 V_2 \sin 2\pi f_2 t$$

In the above expression, $\alpha_2 V_2$ is the voltage amplitude and t is the time. The offset voltage is not considered in the expression. $V_2$ is a basic voltage amplitude value of the second driving signal, and $\alpha_2$ is a voltage amplitude correction coefficient for the second driving signal. The voltage amplitude given to each individual electrode part may be the same or different. That is, the value of $\alpha_2$ may be different for each piezoelectric part. The voltage amplitude may be set in accordance with the magnitude of the stress generated in each individual electrode part. For example, the larger the magnitude of the stress generated in the individual electrode part, the larger the voltage amplitude.

In a case of collecting and generalizing the second driving signals $V_2a$ and $V_2b$, an expression can be represented as $V_2 = \alpha_2 V_2 \sin(2\pi f_2 t + \beta_2 \pi)$.

Here, $\beta_2$ is the phase correction coefficient of the second driving signal, and is 1 In such a case of $V_2a$ having the first phase and is 0 In such a case of $V_2b$ having the second phase, which is the opposite phase to the first phase.

As described above, driving thereof can be very efficiently performed by controlling so as to apply the driving signal to each piezoelectric part according to the direction of the principal stress component having the maximum absolute value in the principal stresses generated in the piezoelectric film 32 of the first actuator 14 in a case of driving the micromirror device 1 in the first resonance mode and the second resonance mode. The drive circuit 50 is configured to input the driving signal to each piezoelectric part.

In the present embodiment, the lower electrodes 31 of the plurality of piezoelectric parts included in each piezoelectric element are common electrodes. Therefore, the lower electrode 31 is grounded and a predetermined driving signal (driving voltage waveform) is input to the upper electrode 33. However, in a case where the lower electrode 31 is also an individual electrode, either the lower electrode 31 or the upper electrode 33 may be used as the earth electrode as long as a driving signal can be applied between the lower electrode 31 and the upper electrode 33.

As the resonance mode, there is not only a mode accompanied by reciprocation rotation of the mirror part 12 around the axis, but also a mode accompanied by a piston motion in the vertical direction, a twisting motion in a plane, or the like. However, in the micromirror device 1 of the present embodiment, the mirror part 12 is driven by using a resonance mode accompanied by reciprocation rotation.

In addition, as the first resonance mode in which the mirror part 12 reciprocates and rotates around the first axis a1, in the resonance mode in which the mirror part 12 and the first actuator 14 oscillate in opposite phases, the Q value of the resonance oscillation is higher and the resonance frequency is higher than that in the resonance mode in which the mirror part 12 and the first actuator 14 oscillate in the same phase. As a result, it is more suitable that scanning is performed at high speed. It is preferable to perform driving in the lowest order mode among the resonance modes in which the mirror part 12 and the first actuator 14 reciprocate and rotate in opposite phases to each other around the first axis a1 since a high Q value can be obtained.

However, the present disclosure is not limited to the above mode. The order mode of the resonance mode to be used may be set appropriately.

Further, as the second resonance mode in which the first actuator 14 and the mirror part 12 are integrally reciprocated and rotated around the second axis a2, a mode, in which a ratio of the resonance frequency of the second resonance mode to the resonance frequency of the first resonance mode is set to be large, is selected among the oscillation modes for reciprocation rotation.

The piezoelectric elements 41 to 46 provided in the first actuator 14 and the second actuator 16 will be described. As described above, the piezoelectric elements 41 to 46 each have a laminated structure of a lower electrode 31, a piezoelectric film 32, and an upper electrode 33.

The thickness of the lower electrode and the upper electrode is not particularly limited, and is, for example, about 200 nm. The thickness of the piezoelectric film is not particularly limited as long as it is 10 μm or less, and is usually 1 μm or more, for example, 1 to 5 μm. The method for forming the lower electrode, the upper electrode and the piezoelectric film is not particularly limited, but the vapor deposition method is preferable, and the sputtering method is particularly preferable.

The main components of the lower electrode are not particularly limited, and are metals or metal oxides such as Au, Pt, Ir, $IrO_2$, $RuO_2$, $LaNiO_3$, and $SrRuO_3$, and combinations thereof.

The main component of the upper electrode is not particularly limited, and examples thereof include materials exemplified for the lower electrode, electrode materials generally used in semiconductor processes such as Al, Ti, Ta, Cr, and Cu, and combinations thereof.

Examples of the piezoelectric film include those containing one or more types of perovskite-type oxides (P) represented by the Expression.

General Expression $ABO_3$     (P)

(In the Expression, A is an element of A site, and at least one element containing Pb. B is an element of B site, and is at least one element selected from the group consisting of Ti, Zr, V, Nb, Ta, Sb, Cr, Mo, W, Mn, Sc, Co, Cu, In, Sn, Ga, Zn, Cd, Fe, and Ni.

O is an oxygen element.

The standard molar ratio of A-site element, B-site element, and oxygen element is 1:1:3, but the molar ratio may deviate from the reference molar ratio within a range in which a perovskite structure can be obtained.)

Examples of the perovskite-type oxide represented by the above-mentioned general Expression include lead-containing compounds such as lead titanate, lead zirconate titanate (PZT), lead zirconate tit, lead zirconate tit lanthanate, lead zirconate titanate lanthanate, lead zirconate titanate magnesium niobate, lead zirconate titanate titanate, and lead zirconate titanate zinc niobate, and mixed crystal systems thereof; lead-free compounds such as barium titanate, strontium barium titanate, bismas sodium niobate, potassium niobate potassium, niobate, sodium, potassium niobate, lithium niobate, and bismas ferrite, and mixed crystal systems thereof.

Further, the piezoelectric film of the present embodiment preferably contains one kind or two or more kinds of perovskite-type oxides (PX) represented by the Expression.

$$A_a(Zr_x, Ti_y, M_{b-x-y})_b O_c \qquad (PX)$$

(In the Expression, A is an element of A site, and at least one element containing Pb. M is at least one element selected from a group which consists of V, Nb, Ta, and Sb.

$0<x<b$, $0<y<b$, $0\leq b-x-y$, and $a:b:c=1:1:3$ are standard, but these molar ratios may deviate from the reference molar ratio within the range where a perovskite structure can be obtained.)

The piezoelectric film consisting of the perovskite-type oxide represented by the above general Expressions (P) and (PX) has a high piezoelectric strain constant ($d_{31}$ constant). Therefore, the piezoelectric actuator comprising such a piezoelectric film is excellent in displacement characteristics. The perovskite-type oxide represented by the general Expression (PX) has a higher piezoelectric constant than that represented by the general Expression (P).

Further, the piezoelectric actuator comprising the piezoelectric film which consists of the perovskite-type oxide represented by the general Expressions (P) and (PX) has a voltage-displacement characteristic with excellent linearity in the driving voltage range. These piezoelectric materials exhibit favorable piezoelectric properties in carrying out the technique of the present disclosure.

Further, it is preferable that the micromirror device of the present disclosure satisfies the following conditions.

First, it is assumed that a resonance frequency in the lowest order mode of resonance modes, in which the mirror part 12 reciprocates and rotates around the first axis a1 and the mirror part 12 and the first actuator 14 reciprocate and rotate in opposite phases to each other, among the plurality of resonance modes corresponding to the plurality of eigenfrequencies peculiar to the micromirror device 1 is Fo, and a resonance frequency in the lowest order mode of resonance modes, in which the mirror part 12 reciprocates and rotates around the first axis a1 and the mirror part 12 and the first actuator 14 reciprocate and rotate in the same phase as each other, is Fi.

Then, $$F1=Fo+Fi, \text{ and}$$

$$F2=Fo-Fi.$$

In such a case, it is preferable that among the resonance frequencies of each of the plurality of resonance modes, a resonance frequency FA closest to F1 is less than F1−100 Hz or greater than F1+450 Hz, and among the resonance frequencies of each of the plurality of resonance modes, a resonance frequency FB closest to F2 is less than F2−100 Hz or greater than F2+450 Hz.

That is, it is preferable that the micromirror device 1 satisfies $$FA<F1-100 \text{ or } F1+450<FA, \text{ and}$$

$$FB<F2-100 \text{ or } F2+450<FB.$$

In other words, it is preferable that there is no resonance mode of the micromirror device 1 in the frequency range of F1−100 Hz or higher and F1+450 Hz or lower, and the frequency range of F2−100 Hz or higher and F2+450 Hz or lower.

In the micromirror device 1 having the present configuration, the frequency Fo is greater than the frequency Fi. The frequency Fo is a frequency in the lowest order mode among the resonance modes in which the mirror part 12 reciprocates and rotates around the first axis a1 and the mirror part 12 and the first actuator 14 reciprocate and rotate in opposite phases to each other. The frequency Fi is a frequency in the lowest order mode among the resonance modes in which the mirror part 12 reciprocates and rotates around the first axis a1 and the mirror part 12 and the first actuator 14 reciprocate and rotate in the same phase as each other.

As described above, as the first resonance mode in which the mirror part 12 reciprocates and rotates around the first axis a1, it is preferable to use the lowest order mode among the resonance modes in which the mirror part 12 and the first actuator 14 reciprocate and rotate in opposite phases to each other. In the following, the first resonance mode, in which the mirror part 12 and the first actuator 14 are driven at the resonance frequency Fo in the lowest order mode among the resonance modes in which the mirror part 12 and the first actuator 14 reciprocate and rotate in opposite phases to each other, is referred to as a driving mode. According to the study performed by the present inventors, by satisfying the above relational expression, it is possible to suppress occurrence of an unnecessary resonance at a frequency different from the resonance frequency Fo in the driving mode in a case of driving in the driving mode. In the micromirror device, in a case where the unnecessary resonance occurs, normal optical scanning may be disturbed by oscillation accompanying the unnecessary resonance (hereinafter, referred to as unnecessary oscillation). In a case where unnecessary oscillation occurs, for example, the scanning line is greatly blurred in both the width direction and the length direction in terms of time. As a result, a problem arises in that a desired scanning angle cannot be achieved. By satisfying the above relational expression, such a defect can be suppressed, and optical scanning at a desired scanning angle can be performed without causing blurring of the scanning line.

Figure 16:
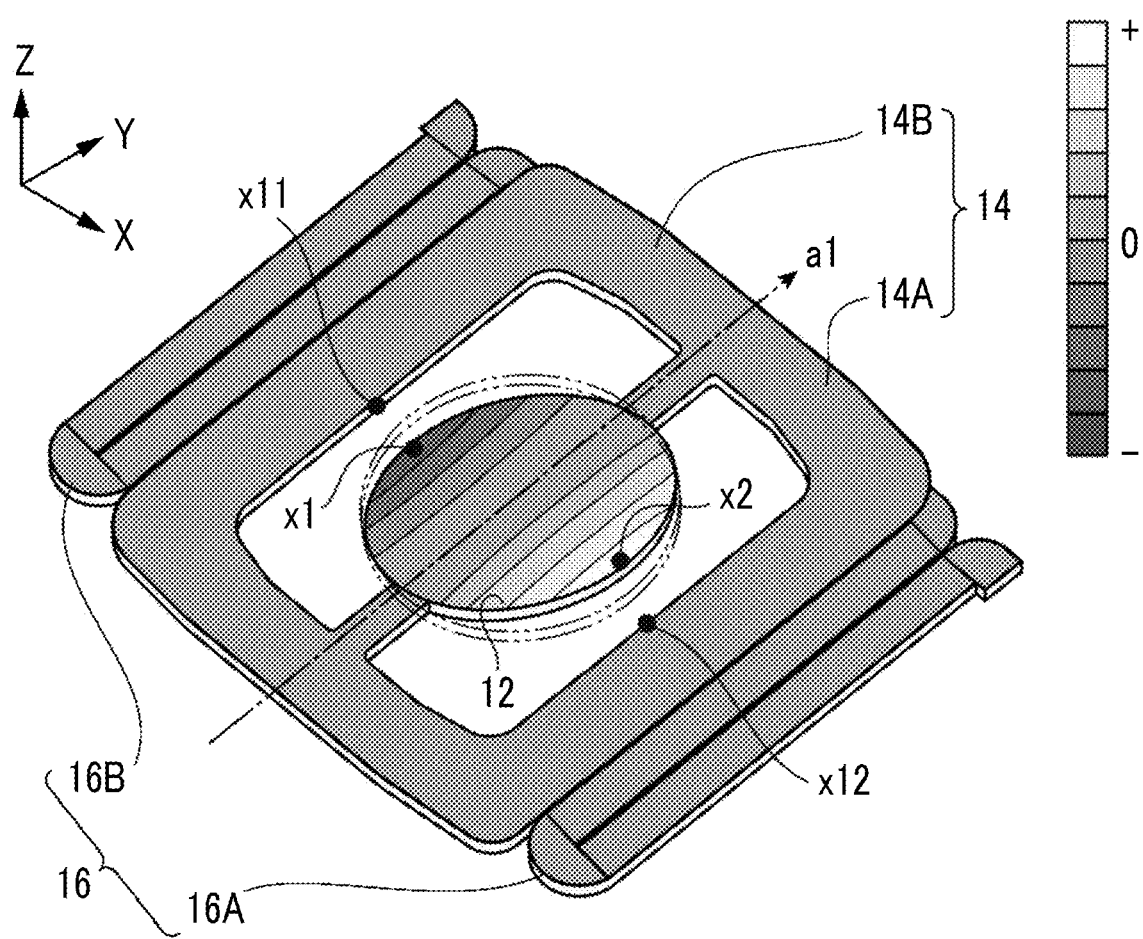
FIG. 16 is a simulation diagram of shape displacement in a driving mode in which a mirror part and a first actuator reciprocate and rotate in opposite phases around a first axis.

FIG. 16 is a simulation diagram showing a state where the mirror part 12 and the first actuator 14 oscillate in the driving mode. The amount of displacement is indicated by the shade. FIG. 16 shows that the darker the color, the larger the displacement in the −z axis direction, and the lighter the color, the larger the displacement in the +z axis direction. The mirror part 12 shows a state where one end x1 in the x-axis direction is tilted and displaced in the −z-axis direction and the other end x2 in the x-axis direction is tilted and displaced in the +z-axis direction, with the first axis a1 set as a center. Further, although the amount of displacement is very small, in the first actuator 14, the part including the point x11 is displaced in the +z-axis direction and the part including the point x12 is displaced in the −z-axis direction, with the first axis a1 set as a center. The point x11 is a point facing one end x1 of the mirror part 12, and the point x12 is a point facing the other end x2 of the mirror part 12. That is, in FIG. 16, the mirror part 12 and the first actuator 14 are displaced in opposite phases.

Figure 17:
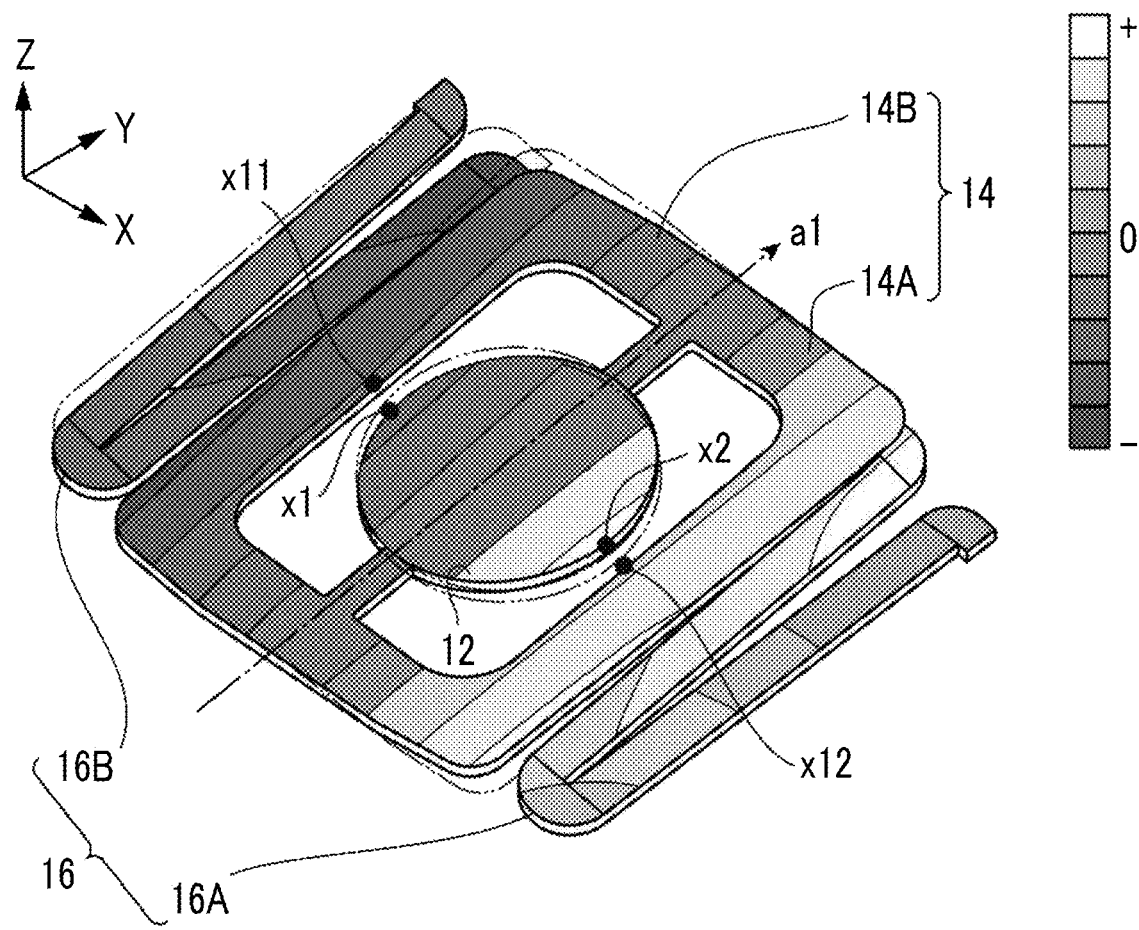
FIG. 17 is a simulation diagram of shape displacement in a resonance mode in which a mirror part and a first actuator reciprocate and rotate in the same phase around a first axis.

FIG. 17 is a simulation diagram showing a state where the mirror part 12 and the first actuator 14 oscillate in the same phase mode. Similar to FIG. 16, the amount of displacement is indicated by the shade. The mirror part 12 shows a state where one end x1 in the x-axis direction is tilted and displaced in the −z-axis direction and the other end x2 in the x-axis direction is tilted and displaced in the +z-axis direction, with the first axis a1 set as a center. Further, in the first actuator 14, the part including the point x11 is displaced in the −z-axis direction and the part including the point x12 is displaced in the +z-axis direction, with the first axis a1 set as a center. That is, in FIG. 17, the mirror part 12 and the first actuator 14 are displaced in the same phase.

Figure 18:
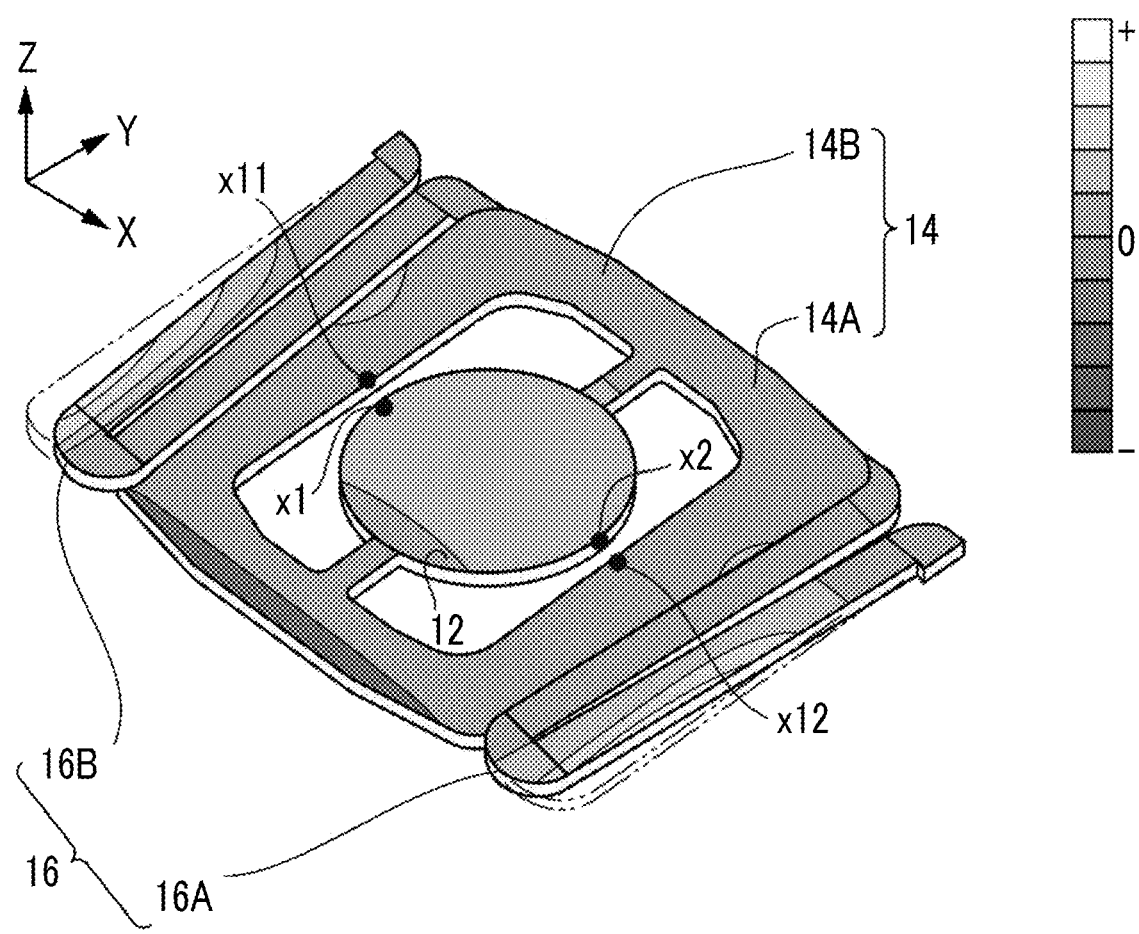
FIG. 18 is a simulation diagram of shape displacement in an unnecessary mode, which may occur in a case of driving the mirror part around the first axis in the driving mode.
Figure 19:
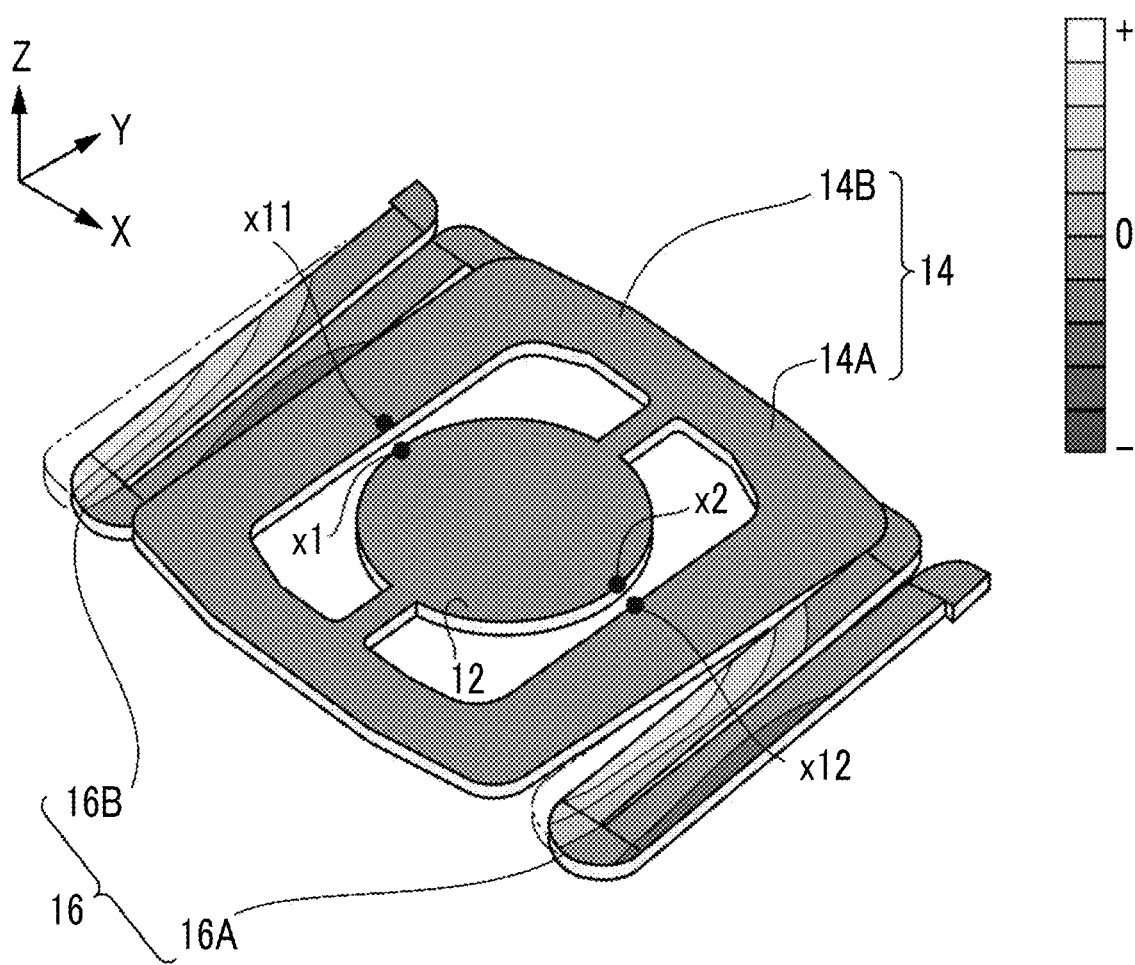
FIG. 19 is a simulation diagram of shape displacement in an unnecessary mode, which may occur in a case of driving the mirror part around the first axis in the driving mode.
Figure 20:
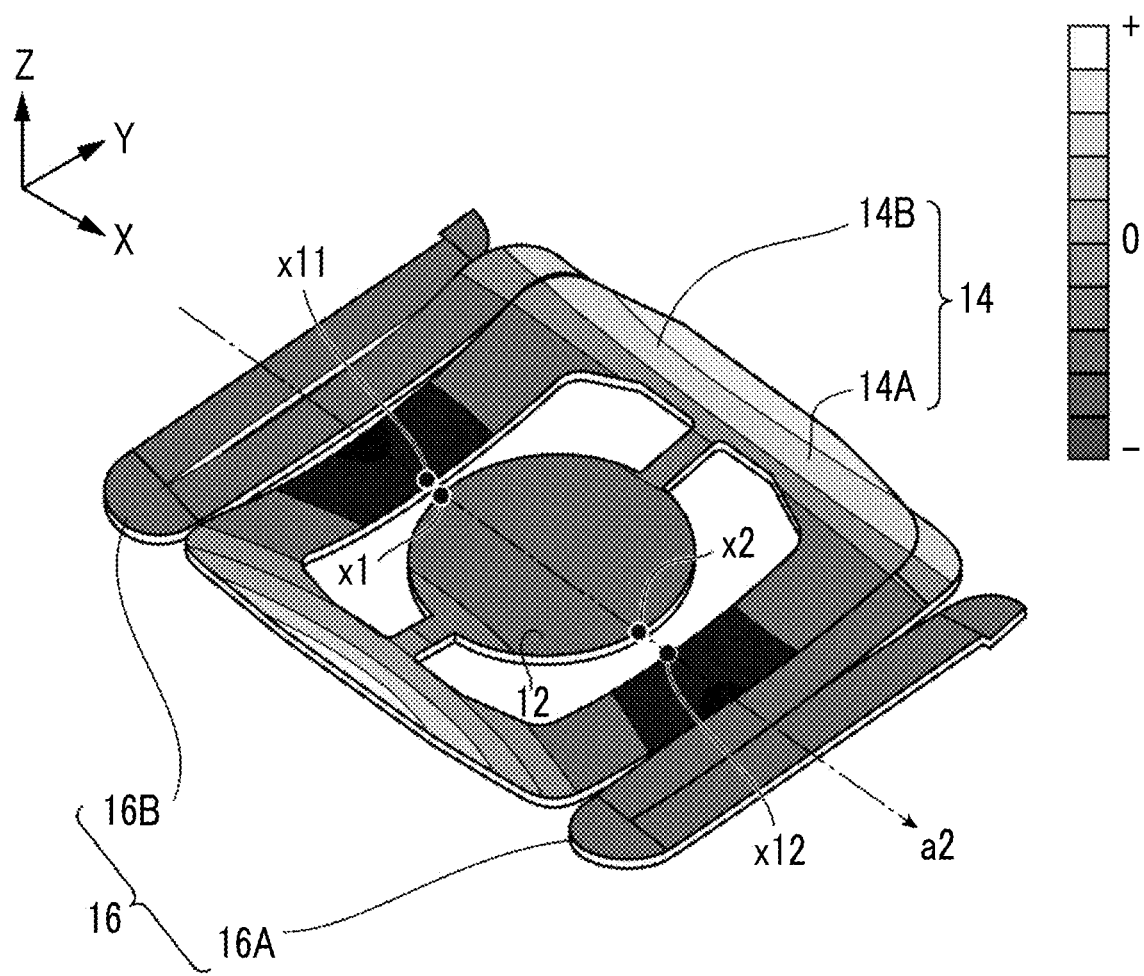
FIG. 20 is a simulation diagram of shape displacement in an unnecessary mode, which may occur in a case of driving the mirror part around the first axis in the driving mode.

In a case where the mirror part 12 is reciprocated and rotated around the first axis a1 in the driving mode shown in FIG. 16, as a resonance mode in which unnecessary oscillation may occur, for example, modes shown in FIGS. 18 to 20 are used.

The resonance mode shown in FIG. 18 is a mode in which the mirror part 12 is slightly displaced in the z-axis direction and the pair of meandering type actuator parts 16A and 16B of the second actuator 16 are displaced in the x-axis direction in opposite phases (hereinafter, referred to as a first unnecessary mode).

The resonance mode shown in FIG. 19 is a mode in which the mirror part 12 is slightly displaced in the z-axis direction and the pair of meandering type actuator parts 16A and 16B of the second actuator 16 are displaced in the x-axis direction in the same phase (hereinafter, referred to as a second unnecessary mode).

The resonance mode shown in FIG. 20 is a mode in which the mirror part 12 and the first actuator 14 are symmetrically distorted about the second axis a2 as a center (hereinafter, referred to as a third unnecessary mode).

In a case where such unnecessary oscillation due to the unnecessary mode is superimposed on the reciprocation rotation caused by the driving mode, the mirror part 12 oscillates unnecessary oscillation other than the reciprocation rotation, and therefore, the scanning line is blurred. As a result, the desired scanning angle is obtained. However, in a case where there is no resonance mode in the frequency band between F1−100 Hz and F1+450 Hz and between F2−100 Hz and F2+450 Hz, it is possible to suppress occurrence of an unnecessary mode in a case of driving in the driving mode. In a case where the mirror part 12 is driven around the first axis a1 in the driving mode, occurrence of resonance due to the unnecessary mode can be suppressed. Therefore, unnecessary oscillation can be suppressed. As a result, it is possible to suppress occurrence of blurring of the scanning line in a range of the desired scanning angle and realize more accurate optical scanning.

The eigenfrequency of the micromirror device 1 is defined by the material, the shape, and the size of the elements constituting the micromirror device 1, and the eigenfrequency can be changed by adjusting the size of each element. Therefore, the size of each element may be adjusted such that the micromirror device 1 satisfies the above relational expression. In manufacturing the micromirror device 1, the reference size of each element is determined in accordance with the desired performance of the micromirror device 1. Based on these reference sizes, a simulation for obtaining the eigenfrequency is performed, and it is examined whether or not the eigenfrequency obtained by the simulation satisfies the above relational expression. In a case where the above relational expression is not satisfied, the size of one of the elements is changed. For example, one or more of the following may be changed: the diameter of the mirror part 12, the length of the connecting part 21 along the direction of the first axis a1 (the length from the outer periphery of the mirror part 12 to the first actuator 14), the width of the connecting part 21 in the direction of the second axis a2, the length of each of the rectangular plate-like parts 61 of the meandering type actuator parts 16A and 16B along the direction of the first axis a1 and the width in the direction of the second axis a2, and the width and the second width of the first actuator 14 in the direction of the first axis a1 and the widths in the direction of the second axis a2.

EXAMPLES

Hereinafter, the micromirror devices of examples of the present disclosure will be described.

Example 1

The micromirror device having the configurations shown in FIG. 1 was manufactured as Example 1 by the following procedure.
Manufacturing Method (Step 1) A Ti layer with 30 nm was formed and an Ir layer with 150 nm was formed, at a substrate temperature of 350° C., by a sputtering method, on an silicon on insulator (SOI) substrate having a laminated structure of a Si handle layer 350 μm, a silicon oxide ($SiO_2$) box layer 1 μm, and a Si device layer 100 μm. The laminated structures of the Ti layer and the Ir layer correspond to the lower electrode 31 in FIG. 2.

(Step 2) A piezoelectric film with 3 μm was formed on the substrate on which the lower electrodes (Ti/Ir) obtained above were laminated and formed using a radio frequency (RF) sputtering device. As the target material for sputtering film formation for the piezoelectric film, a material having a composition of $Pb_{1.3}((Zr_{0.52}Ti_{0.48})_{0.88} Nb_{0.12}) O_3$ was used. The film forming pressure was 2.2 mTorr, and the film forming temperature was 450° C. The obtained piezoelectric film was an Nb-doped PZT thin film to which Nb was added at an atomic composition ratio of 12%.

(Step 3) An upper electrode including the plurality of individual electrode parts using a Pt/Ti laminated structure was patterned by a lift-off method, on the substrate on which the piezoelectric film obtained above was formed.

(Step 4) After that, the piezoelectric film and the lower electrode were pattern-etched by inductively coupled plasma (ICP) dry etching.

(Step 5) Further, an insulating layer consisting of $SiO_2$ was formed on the entire surface by a chemical vapor deposition method (TEOS-CVD: tetraethoxysilane-chemical vapor deposition) using tetraethoxysilane as a raw material, and then the insulating layer was patterned by the ICP dry etching.

(Step 6) A laminated structure of Au/Ti was formed into a pattern, and a reflecting surface of a mirror part, an electrode terminal, and a wiring layer were formed, by the lift-off method.

(Step 7) The device layer was pattern-etched by a silicon dry etching process to process the shapes of the actuator, the mirror part, and the fixing member.

(Step 8) Next, the handle layer was subject to deep-drilled reactive ion etching from the back surface of the substrate. Basically, the handle layer was removed such that a part to be a fixing member remains.

(Step 9) Finally, the micromirror device 1 described with reference to FIG. 1 was manufactured by removing the box layer from the back surface by dry etching.

In the above manufacturing step, the reflecting surface of the mirror part is formed in Step 6, but the reflecting surface may be formed by using a reflective material different from the material of the electrode terminal and the wiring layer.

In that case, for example, subsequently to Step 6, the reflecting surface may be formed by a lift-off method or the like.

The size of each element of the micromirror device 1 of the present Example 1 is as follows.

Figure 26:
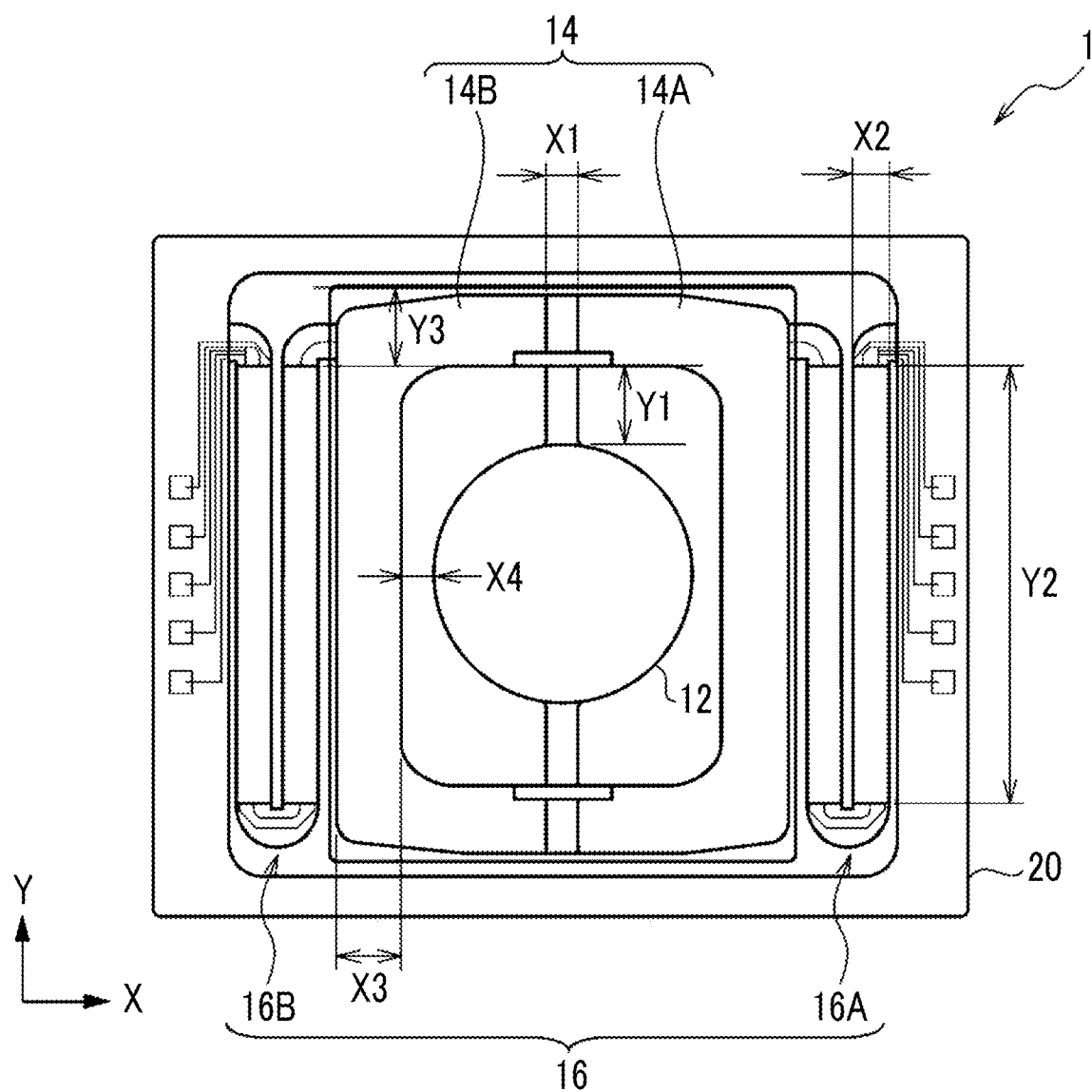
FIG. 26 is a diagram for explaining the size of each element of the micromirror device of Examples 11 to 24.

The diameter of the mirror part 12 was set to 2.7 mm, the length Y1 of the connecting part 21 in the y-axis direction (the length from the outer periphery of the mirror part 12 to the first actuator 14) was set to 0.77 mm, the width X1 in the x-axis direction thereof was set to 0.38 mm, The length Y2 in the y-axis direction of each of the rectangular plate-like parts 61 of the meandering type actuator parts 16A and 16B was set to 4.5 mm and the width X2 in the x-axis direction thereof was set to 0.4 mm (refer to FIG. 26).

The thicknesses of the mirror part 12, the first actuator 14, the second actuator 16, and the connecting part 21 are equal to the thickness of the device layer.

In the micromirror device having the present configuration, the sizes of the first actuator 14 and the connecting part 21 are set such that the frequency of the first resonance mode on the high-speed drive side is 20 kHz, and the second resonance mode is configured to have the smallest order among the resonance modes with reciprocation rotation on the lower frequency side than the first resonance mode.

In the present Example 1, as described with reference to FIGS. 12 to 15, the first actuator 14 is driven by the first driving signal having the first resonance frequency, and the second actuator 16 is driven by the second driving signal having the second resonance frequency.

Reference Example

Figure 21:
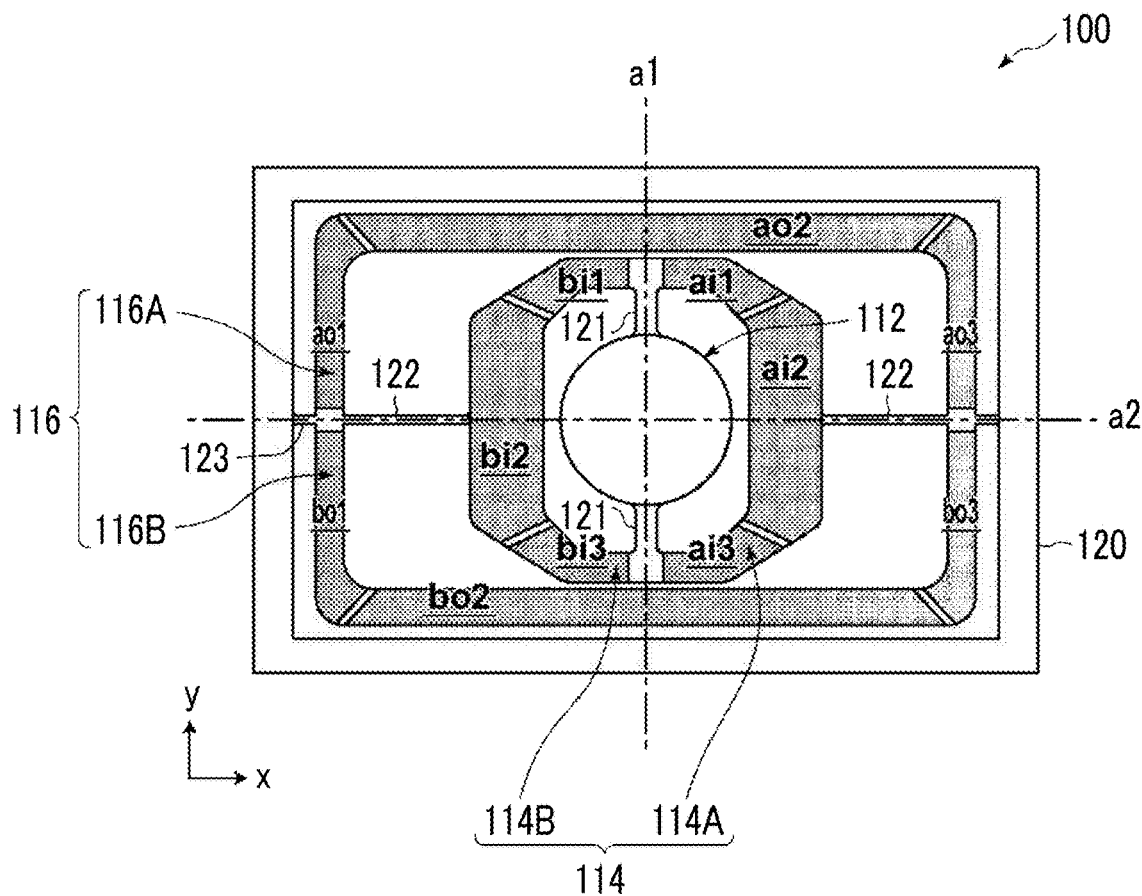
FIG. 21 is a plan view of a reference example micromirror device.

FIG. 21 shows a plan view of the micromirror device 100 of a reference example. The micromirror device of the reference example was manufactured by the same manufacturing procedure as in Example 1. The micromirror device 100 of the reference example comprises a mirror part 112, an annular first actuator 114 disposed so as to surround the mirror part 112, an annular second actuator 116 surrounding the first actuator 114, a fixing part 120, a first connecting part 121, a second connecting part 122, and a third connecting part 123. Each of the actuators 114 and 116 is a piezoelectric actuator provided with a piezoelectric element.

The first actuator 114 comprises a pair of semi-annular actuator parts 114A and 114B each provided with a piezoelectric element, and the pair of semi-annular actuator parts 114A and 114B is connected on the first axis a1 through the first connecting part 121 so as to surround the mirror part 112. The second actuator 116 comprises a pair of semi-annular actuator parts 116A and 116B each provided with a piezoelectric element, and the pair of semi-annular actuator parts 116A and 116B is connected on the second axis a2 through the second connecting part 122 so as to surround the first actuator 114.

In the first actuator 114 and the second actuator 116, the region indicated by hatching is an individual electrode part constituting the upper electrode of the piezoelectric element. Each of the upper electrodes of the semi-annular actuator parts 114A, 114B, 116A, and 116B consists of three individual electrode parts, and comprises three piezoelectric parts defined by the individual electrode parts. The first actuator 114 comprises a total of six individual electrode parts ai1 to ai3 and bi1 to bi3. The second actuator 116 comprises a total of six individual electrode parts ao1 to ao3 and bo1 to bo3.

The first actuator 114 is in charge of driving reciprocation rotation around the first axis a1, and the second actuator 116 is in charge of driving reciprocation rotation around the second axis a2.

Figure 22:
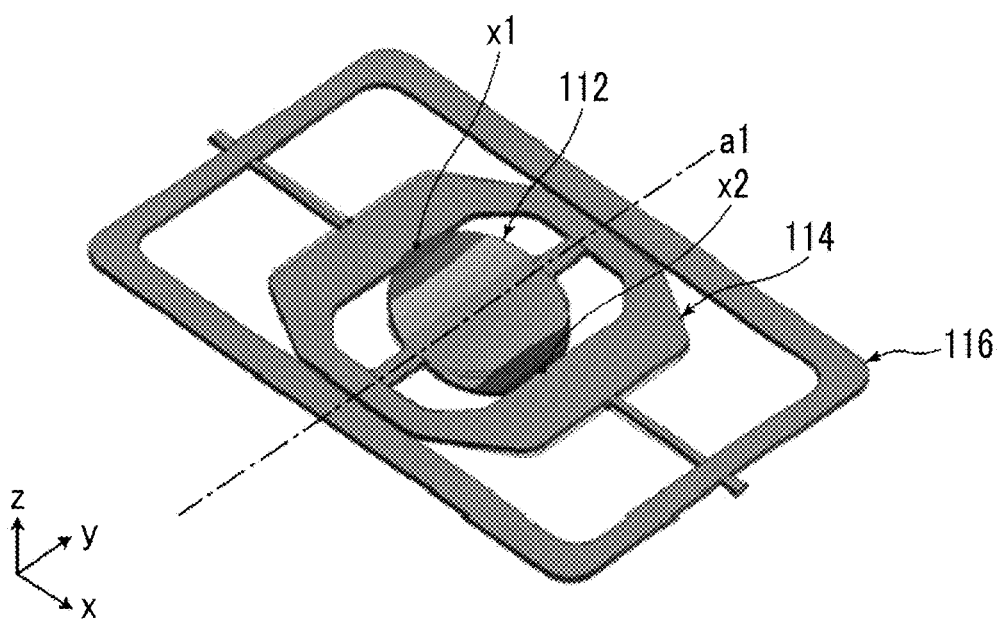
FIG. 22 is a simulation diagram of shape displacement in the first resonance mode accompanied by reciprocation rotation of the mirror part around the first axis in the micromirror device of the reference example.

FIG. 22 is a simulation diagram of a state where the mirror part 112 reciprocates and rotates around the first axis a1 in the first resonance mode, and shows a state where one end x1 of the mirror part 112 in the x-axis direction around the first axis a1 as a center is tilted and displaced in the +z-axis direction and the other end x2 thereof in the x-axis direction is tilted and displaced in the −z-axis direction. In FIG. 22, the fixing part is removed, and the shade of color indicates the amount of displacement. The darker the color, the larger the amount of displacement.

In the maximum displacement state in a case where the first actuator 114 is driven in the first resonance mode, the individual electrode parts of the first semi-annular actuator parts 114A and 114B provided in accordance with whether the sign of the principal stress component having the maximum absolute value among the principal stresses generated in the in-plane direction of the piezoelectric film of the first actuator 114 is positive or negative, and is separated by the stress inversion region.

In the maximum displacement state in a case where the second actuator 116 is driven in the second resonance mode, the individual electrode parts of the second semi-annular actuator parts 116A and 116B provided in accordance with whether the sign of the principal stress component having the maximum absolute value among the principal stresses generated in the in-plane direction of the piezoelectric film of the second actuator 116 is positive or negative, and is separated by the stress inversion region.

Figure 23:
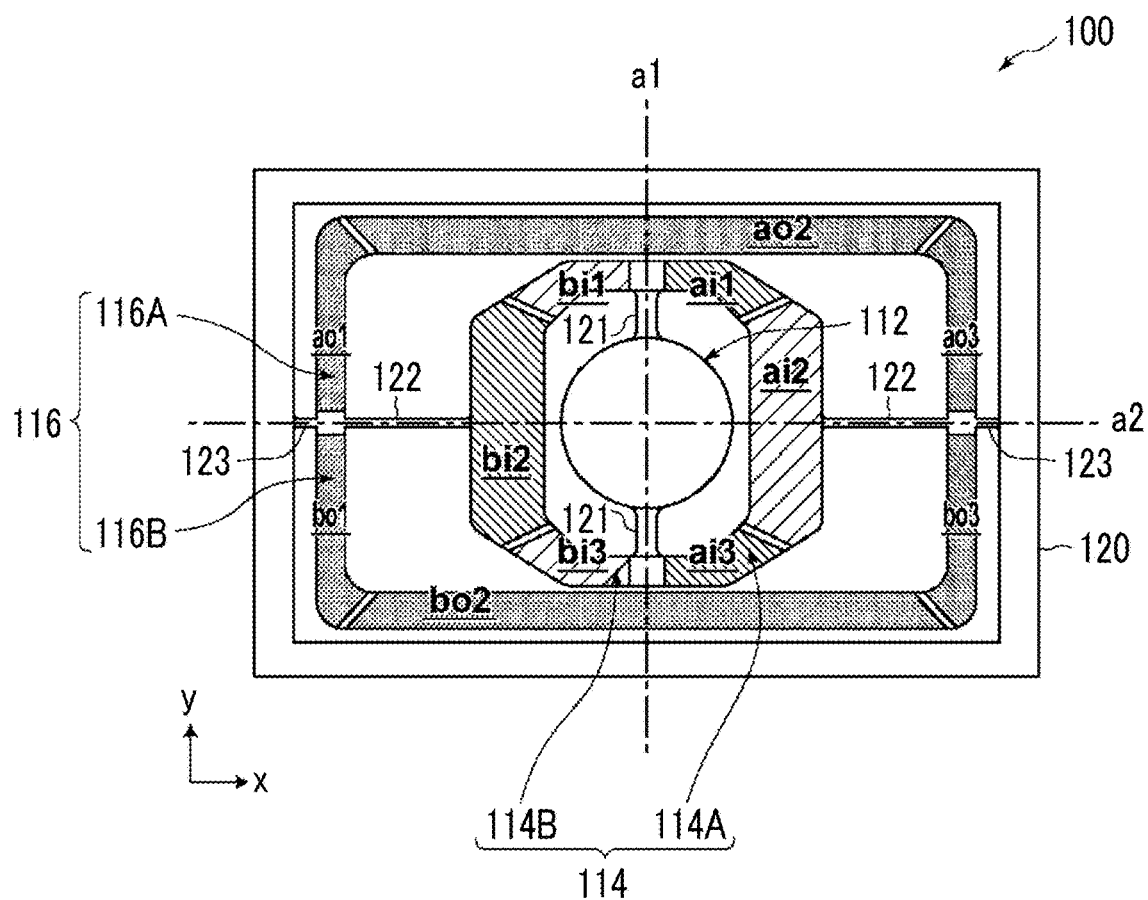
FIG. 23 is a diagram for explaining a driving method in a case of driving around the first axis of the micromirror device of the reference example.

In the first actuator 114, the individual electrode parts driven in the same phase are indicated by the same diagonal lines. In FIG. 23, the individual electrode parts ai2, bi1, and bi3 indicated by the diagonal right upward lines correspond to the tensile stress region t1. In FIG. 23, the individual electrode parts ai1, ai3, and bi2 indicated by the diagonal right downward lines correspond to the compressive stress regions c1. A first driving signal for the first resonance mode having opposite phases is applied between the individual electrode parts corresponding to the tensile stress regions t1 and the individual electrode parts corresponding to the compressive stress regions c1.

As shown in FIG. 22, a driving signal was input to each piezoelectric part of the first actuator 114 in order to reciprocate and rotate the mirror part 112 around the first axis a1. Here, in FIG. 23, the high-speed driving signal of $V_1b$ shown in FIG. 13 was input to the individual electrode parts ai2, bi1, and bi3 indicated by the diagonal right upward line, and the high-speed driving signal of $V_1a$ shown in FIG. 13 was input to the individual electrode parts ai1, ai3, and bi2 indicated by the diagonal right downward line. That is, driving signals having the same high-speed frequency and opposite phases to each other were input to the individual electrode parts ai2, bi1 and bi3 and the individual electrode parts ai1, ai3 and bi2.

Figure 24:
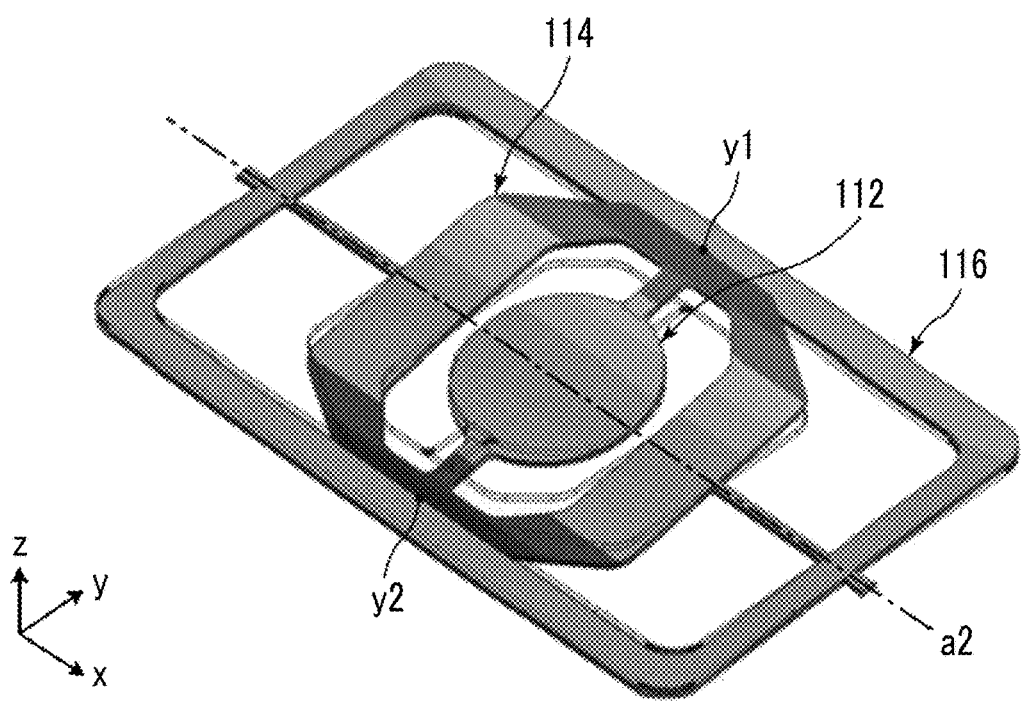
FIG. 24 is a simulation diagram of shape displacement in the second resonance mode accompanied by reciprocation rotation of the mirror part around the second axis in the micromirror device of the reference example.

FIG. 24 is a simulation diagram showing a situation in which the mirror part 112 and the first actuator 114 reciprocate and rotate around the second axis a2 in the second resonance mode, and shows a state where one end y1 in the y-axis direction of the first actuator 114 is tilted and displaced in the +z-axis direction and the other end y2 in the y-axis direction is tilted and displaced in the −z-axis direction with respect to the second axis a2 as a center of the mirror part 112 and the first actuator 114. Similarly to FIG.

22, in FIG. 24, the shade of color indicates the amount of displacement. The darker the color, the larger the amount of displacement.

Figure 25:
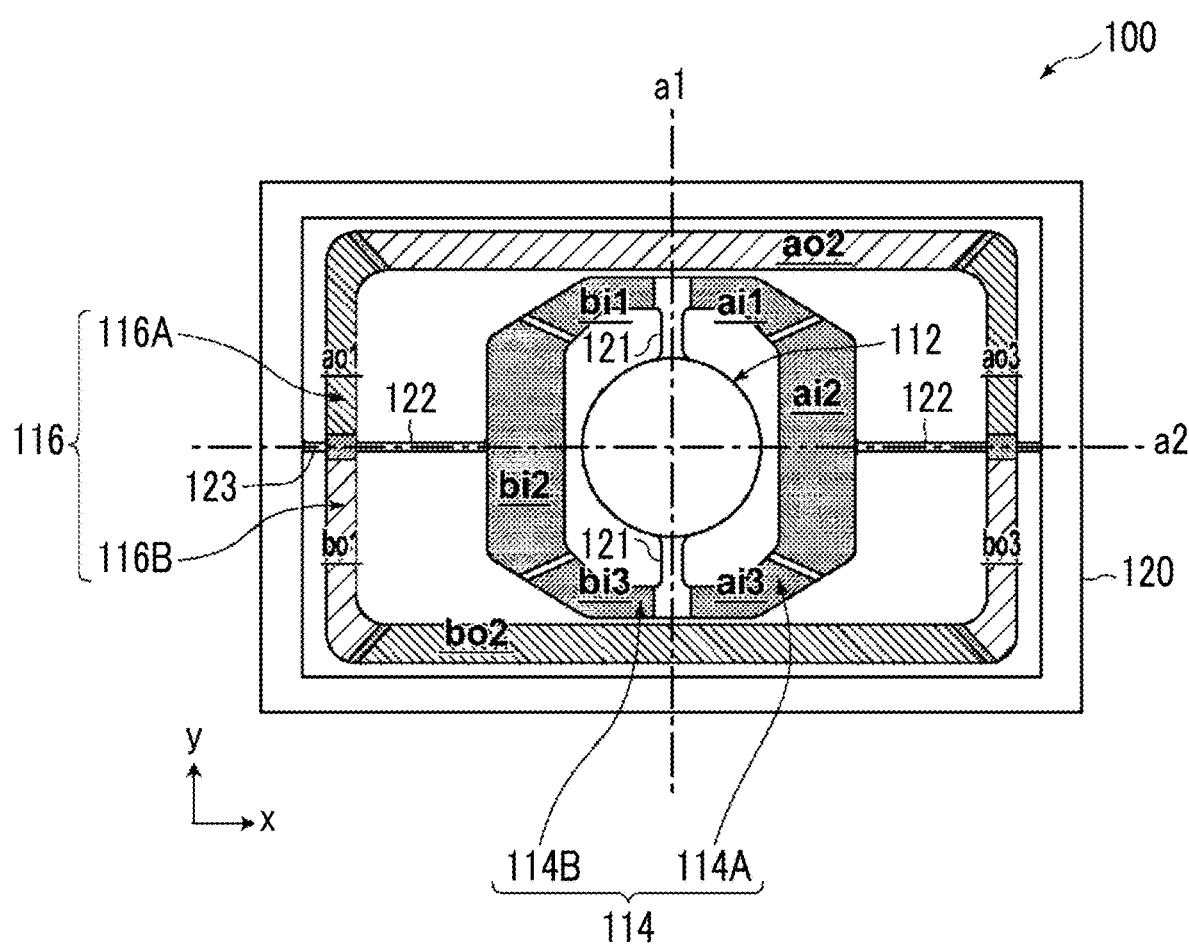
FIG. 25 is a diagram for explaining a driving method in a case of driving around the second axis of the micromirror device of the reference example.

As shown in FIG. 24, a driving signal was input to each piezoelectric part of the second actuator 116 in order to reciprocate and rotate the first actuator 114 and the mirror part 112 around the second axis a2. Here, in FIG. 25, the low-speed driving signal of V2b shown in FIG. 15 was input to the individual electrode parts ao2, bo1, and bo3 indicated by the diagonal right upward line, and the low-speed driving signal of V2a shown in FIG. 15 was input to the individual electrode parts ao1, bo3, and bo2 indicated by the diagonal right downward line. That is, driving signals having opposite phases to each other at the same low-speed frequency were input to the individual electrode parts ao2, bo1, and bo3 and the individual electrode parts ao1, ao3, and bo2.

The first resonance frequency and the second resonance frequency were measured for the micromirror devices of Example 1 and the reference example. Further, the voltage amplitude of the first driving signal, which is necessary to perform scanning of 45° around the first axis a1 is performed in a case of driving in the first resonance mode and the second resonance mode respectively using the drive waveforms of the first resonance frequency and the second resonance frequency, was examined. In addition, the voltage amplitude of the second driving signal, which is necessary to perform scanning of 30° around the second axis a2, was examined. Table 1 shows the results. The optical scanning angle was measured in the following method. Laser is vertically incident onto the reflecting surface of the mirror part of the micromirror device, the length of the scanning line is measured using a ruler, and the like, and the total angle of scanning is calculated from the geometrical relationship.

TABLE 1

|  | Example1 | Reference example |
|---|---|---|
| Mirror size (diameter) | 2.7 mm | 2.7 mm |
| Structure body part size | 7 mm × 6 mm | 11 mm × 7 mm |
| Resonance frequency (around second axis) | 1.2 kHz | 1.8 Hz |
| Resonance frequency (around first axis) | 20 kHz | 19 kHz |
| Ratio of frequencies | 17 | 11 |
| Voltage amplitude (around second axis) | 5 | 10 |
| Voltage amplitude (around first axis) | 12.5 | 12.5 |

In Table 1, the size of the body of the structure is the length in the x-axis direction×the length in the y-axis direction of the inner periphery of the solid frame (fixing part 20).

Example 1 and the reference example are micromirror devices provided with mirror parts having the same size. However, in Example 1, the size of the body part of the structure can be made smaller than that of the reference example. This is an effect in which the second actuator is composed of a pair of meandering type actuator parts. In addition, the resonance frequency around the second axis could be significantly reduced, and the ratio of frequencies could be made to have an extremely large value of 17.

Further, as shown in Table 1, in the present Example 1, the voltage amplitude around the second axis can be significantly reduced as compared with the reference example, and as a result, it is apparent that power consumption can be suppressed.

Next, the results of examining the presence or absence of unnecessary oscillation by changing the size of the components of the micromirror device shown in FIG. 26 in the same manner as in Example 1 mentioned above will be described. In the following Examples 11 to 24, manufacturing were performed in the same procedure as in Example 1.

Examples 11 to 16

In the micromirror devices of Examples 11 to 16, the diameter of the mirror part 12 was 2.7 mm. The sizes of X1 to X3 and Y1 to Y3 in the plan view of the micromirror device shown in FIG. 26 were changed. Specifically, as shown in Table 2, the values of the following were set: the width X1 in the x-axis direction and the length Y1 in the y-axis direction of the connecting part 21 of each example, the width X2 in the x-axis direction and the length Y2 in the y-axis direction of each of the rectangular plate-like parts 61 of the meandering type actuator parts 16A and 16B, the width X3 in the x-axis direction of the part extending in the y-axis direction of the first actuator 14, and the width Y3 in the y-axis direction of the part extending in the x-axis direction. The other components were the same as in Example 1.

(Frequency and Frequency Difference of Various Resonance Modes)

In the micromirror device having each example, the frequency Fo and the frequency Fi were obtained. The frequency Fo is a frequency in the lowest order mode among the resonance modes in which the mirror part 12 reciprocates and rotates around the first axis and the mirror part 12 and the first actuator 14 reciprocate and rotate in opposite phases to each other. The frequency Fi is a frequency in the lowest order mode among the resonance modes in which the mirror part reciprocates and rotates around the first axis and the mirror part 12 and the first actuator 14 reciprocate and rotate in the same phase as each other.

Then, $F1=Fo+Fi$, and $F2=Fo-Fi$ were calculated.

Among the frequencies of each of the plurality of resonance modes, the frequency near F1 and the frequency near F2 were examined. None of the frequencies of the plurality of resonance modes of each of the micromirror devices of Examples 11 to 16 existed within F1±1 kHz. There were a plurality of resonance modes (unnecessary modes) near F2. Table 3 shows three frequencies FB1, FB2, and FB3 that are close to F2. FB1 was the resonance frequency of the first unnecessary mode shown in FIG. 18, FB2 was the resonance frequency of the second unnecessary mode shown in FIG. 19, and FB3 was the resonance frequency of the third unnecessary mode shown in FIG. 20. In the table, the frequency FB closest to F2 among the three frequencies is indicated by the bold type. In Examples 11 to 16, FB2=FB. Then, the frequency difference $\Delta F2=F2-FB$ between FB and F2 was obtained.

Here, the frequencies near the frequencies Fi, Fo, and F1 and the frequencies near F2 were calculated by analysis of the resonance mode of commercially available finite element software. In an actual device, by finding the relationship between the amount of displacement and the frequency of the driving signal which is input to the external oscillation or the actuator, it is also possible to obtain a point, at which the amount of displacement is a peak, as the resonance frequency.

(Evaluation)

In the micromirror devices of Examples 11 to 16, a sine wave signal having the frequency Fo in the driving mode was input to the first actuator 14 as a driving signal, and a first axis scanning operation by which the mirror part 12 is rotated around the first axis was performed. The voltage amplitude of the driving signal was gradually increased, and it was examined whether an optical scanning angle of 45° could be achieved without generating unnecessary oscillation. A visible light laser was vertically incident on the reflecting surface of the mirror part 12 of the micromirror device 1, and a scanning line was projected on the screen. In some examples, it can be seen that the optical scanning angle of 45° could not be achieved and there is a phenomenon in which the scanning line was temporally blurred in the width direction and the length direction. For each example, the presence or absence of blurring of the scanning line was confirmed, and the scanning operation was evaluated. It is considered that the blurring of the scanning line is a result of occurrence of oscillation other than the scanning operation in the driving mode, so-called unnecessary oscillation. In Table 3, the case where the optical scanning angle of 45° can be achieved without the above-mentioned unnecessary oscillation is written as "None", and the case where the unnecessary oscillation occurs is written as "Yes".

Table 2 shows sizes of the components of each example, and Table 3 shows various frequencies, frequency differences, and evaluation results.

TABLE 2

| | Dimension information (mm) | | | | | | | |
|---|---|---|---|---|---|---|---|---|
| Example | Mirror diameter | X1 | X2 | X3 | X4 | Y1 | Y2 | Y3 |
| 11 | 2.7 | 0.38 | 0.4 | 0.8 | 0.3 | 0.77 | 4.5 | 0.87 |
| 12 | 2.7 | 0.38 | 0.4 | 0.8 | 0.3 | 0.77 | 4.5 | 0.8 |
| 13 | 2.7 | 0.38 | 0.4 | 0.8 | 0.3 | 0.77 | 4.45 | 0.8 |
| 14 | 2.7 | 0.38 | 0.4 | 0.8 | 0.3 | 0.77 | 4.42 | 0.8 |
| 15 | 2.7 | 0.38 | 0.42 | 0.8 | 0.3 | 0.77 | 4.5 | 0.8 |
| 16 | 2.7 | 0.38 | 0.38 | 0.8 | 03 | 0.77 | 4.5 | 0.8 |

TABLE 3

| Example | Driving mode frequency (Hz) Fo | Same phase mode frequency (Hz) Fi | Frequency difference (Hz) F2 = Fo − Fi | Frequency of unnecessary mode occurring near F2 (Hz) | | | Difference between frequency F2 and FB of unnecessary mode closest to F2 (Hz) ΔF2 = F2 − FB | Unnecessary oscillation occurrence |
|---|---|---|---|---|---|---|---|---|
| | | | | FB1 | FB2 | FB3 | | |
| 11 | 20483 | 2772 | 17711 | 15884 | 17604 | 20519 | 107 | No |
| 12 | 20460 | 2785 | 17675 | 15897 | 17659 | 21313 | 16 | Yes |
| 13 | 20468 | 2825 | 17643 | 16156 | 17959 | 21348 | −316 | Yes |
| 14 | 20470 | 2849 | 17621 | 16313 | 18140 | 21368 | −519 | No |
| 15 | 20463 | 2823 | 17640 | 16375 | 18273 | 21333 | −633 | No |
| 16 | 20468 | 2745 | 17723 | 15397 | 17025 | 21900 | 698 | No |

Examples 17 to 24

In the micromirror devices of Examples 17 to 24, the diameter of the mirror part 12 was set to 3 mm. As shown in Table 4, the values of the following were set: the width X1 in the x-axis direction and the length Y1 in the y-axis direction of the connecting part 21 of each example, the width X2 in the x-axis direction and the length Y2 in the y-axis direction of each of the rectangular plate-like parts 61 of the meandering type actuator parts 16A and 16B, the width X3 in the x-axis direction of the part extending in the y-axis direction of the first actuator 14, and the width Y3 in the y-axis direction of the part extending in the x-axis direction. The other components were the same as in Example 1.

(Frequency and Frequency Difference of Various Resonance Modes)

In the micromirror devices of Examples 17 to 24, the frequencies Fo and Fi were obtained in the same manner as in the above Examples 11 to 16.

$$F1=Fo+Fi, \text{ and}$$

$$F2=Fo-Fi,$$

were calculated.

Among the frequencies of each of the plurality of resonance modes, the frequency near F1 and the frequency near F2 were examined. None of the frequencies of the plurality of resonance modes of each of the micromirror devices of Examples 17 to 24 existed within F2±1 kHz. There were a plurality of resonance modes (unnecessary modes) near F1. Table 5 shows three frequencies FA1, FA2, and FA3 that are close to F1. FA1 was the resonance frequency of the first unnecessary mode shown in FIG. 18, FA2 was the resonance frequency of the second unnecessary mode shown in FIG. 19, and FA3 was the resonance frequency of the third unnecessary mode shown in FIG. 20. In the table, the frequency FA closest to F1 among the three frequencies is indicated by the bold type. In Examples 17-19, 23 and 24, FA1=FA, and in Examples 20-22, FA2=FA. Then, the frequency difference ΔF1=F1−FA between FA and F1 was obtained.

(Evaluation)

Evaluation was performed in the same manner as cases of Examples 11 to 16.

Table 4 shows sizes of the components of each example, and Table 5 shows various frequencies, frequency differences, and evaluation results.

TABLE 4

| | Dimension information (mm) | | | | | | | |
|---|---|---|---|---|---|---|---|---|
| Example | Mirror diameter | X1 | X2 | X3 | X4 | Y1 | Y2 | Y3 |
| 17 | 3 | 0.35 | 0.55 | 1 | 0.3 | 0.8 | 4.5 | 0.8 |
| 18 | 3 | 0.35 | 0.55 | 1.5 | 0.3 | 0.77 | 4.5 | 0.8 |
| 19 | 3 | 0.35 | 0.55 | 0.8 | 0.3 | 0.77 | 4.5 | 0.8 |
| 20 | 3 | 0.35 | 0.44 | 1 | 0.3 | 0.77 | 4.5 | 0.8 |

TABLE 4-continued

| | | Dimension information (mm) | | | | | | |
|---|---|---|---|---|---|---|---|---|
| Example | Mirror diameter | X1 | X2 | X3 | X4 | Y1 | Y2 | Y3 |
| 21 | 3 | 0.35 | 0.45 | 1 | 0.3 | 0.77 | 4.5 | 0.8 |
| 22 | 3 | 0.35 | 0.55 | 1 | 0.3 | 0.77 | 5 | 0.8 |
| 23 | 3 | 0.35 | 0.55 | 1 | 0.3 | 0.77 | 4.5 | 1 |
| 24 | 3 | 0.35 | 0.55 | 1 | 0.3 | 0.77 | 4.5 | 0.9 |

TABLE 5

| | Driving mode frequency (Hz) | Same phase mode frequency (Hz) | Frequency difference (Hz) | Frequency of unnecessary mode occurring near F1 (Hz) | | | Difference between frequency F1 and FA of unnecessary mode closest to F1 (Hz) | Unnecessary oscillation |
|---|---|---|---|---|---|---|---|---|
| Example | Fo | Fi | F1 = FO + Fi | FA1 | FA2 | FA3 | AF1 = F1 − FA | occurrence |
| 17 | 15846 | 2727 | 18573 | 18592 | 21474 | 19955 | −19 | Yes |
| 18 | 15546 | 2478 | 18024 | 18225 | 21246 | 20259 | −201 | Yes |
| 19 | 16036 | 2879 | 18915 | 18736 | 21498 | 19762 | 179 | No |
| 20 | 15855 | 2582 | 18437 | 16510 | 18608 | 19899 | −171 | Yes |
| 21 | 15854 | 2600 | 18454 | 16744 | 18919 | 19908 | −465 | No |
| 22 | 15837 | 2370 | 18207 | 16265 | 18608 | 19270 | −401 | Yes |
| 23 | 15947 | 2700 | 18647 | 18509 | 21266 | 17946 | 138 | No |
| 24 | 15904 | 2713 | 18617 | 18551 | 21374 | 18910 | 66 | Yes |

As shown in Table 3, in Examples 12 and 13 in which unnecessary oscillation occurred, FB was in the frequency range of F2−100 Hz or more and F2+450 Hz or less. On the other hand, in Examples 11 and 14 to 16 in which unnecessary oscillation did not occur, FB was present outside the range of F2−100 Hz or more and F2+450 Hz or less, that is, less than F2−100 Hz or greater than F2+450 Hz.

As shown in Table 5, in Examples 17, 18, 20, 22 and 24 in which unnecessary oscillation occurred, FA was in the frequency range of F1−100 Hz or more and F1+450 Hz or less. On the other hand, in Examples 19, 21, and 23 in which unnecessary oscillation did not occur, FA was present outside the range of F1−100 Hz or more and F1+450 Hz or less, that is, less than F1−100 Hz or greater than F1+450 Hz.

As described above, in a case where FA was less than F1−100 Hz or greater than F1+450 Hz and FB was less than F2−100 Hz or greater than F2+450 Hz, it was possible to perform a favorable optical scanning in which unnecessary oscillation did not occur and the scanning line was not blurred.

In carrying out the technique of the present disclosure, the present disclosure is not limited to the configuration and manufacturing method of the present example, and the substrate material, electrode material, piezoelectric material, film thickness, film forming conditions, and the like may be appropriately selected in accordance with the purpose.

The entire disclosure of Japanese Patent Application No. 2019-086634A filed on Apr. 26, 2019 and Japanese Patent Application No. 2020-076927A filed on Apr. 23, 2020 is incorporated into the present specification by reference.

All documents, patent applications, and technical standards described in the present specification are incorporated into the present specification by reference to the same extent as in a case where the individual documents, patent applications, and technical standards were specifically and individually stated to be incorporated by reference.

What is claimed is:

1. A micromirror device comprising:
a mirror part that has a reflecting surface that reflects light;
a first actuator that includes a pair of semi-annular actuator parts, each including a piezoelectric element, and that is disposed such that the pair of semi-annular actuator parts surrounds the mirror part;
a connecting part that connects the mirror part and the first actuator such that the mirror part is rotatable around a first axis;
a fixing part that is disposed at an outer periphery of the first actuator; and
a second actuator that is disposed between the first actuator and the fixing part and includes a pair of meandering type actuator parts, each including one or more rectangular plate-like parts that include a piezoelectric element,
wherein each of the pair of meandering type actuator parts is disposed such that a longitudinal direction of the rectangular plate-like part is a direction along the first axis, one end of each of the pair of meandering type actuator parts is directly connected to an outer periphery of each of the pair of semi-annular actuator parts, and another end of each of the pair of meandering type actuator parts is connected to the fixing part,
each piezoelectric element has a structure in which a lower electrode, a piezoelectric film, and an upper electrode are layered, and
the first actuator applies a rotational torque around the first axis to the mirror part, and the second actuator applies a rotational torque around a second axis intersecting with the first axis to the first actuator, so as to two-dimensionally rotationally drive the mirror part around the first axis and the second axis,
wherein, assuming that a resonance frequency in a lowest order mode among resonance modes in which the mirror part reciprocates and rotates around the first axis and the mirror part and the first actuator reciprocate and rotate in opposite phases to each other is Fo, and a resonance frequency in a lowest order mode among resonance modes in which the mirror part reciprocates and rotates around the first axis and the mirror part and the first actuator reciprocate and rotate in the same phase as each other is Fi, $F1=Fo+Fi$, and $F2=Fo-Fi$, where among the resonance frequencies of each of the plurality of resonance modes, a resonance frequency closest to F1 is less than F1−100 Hz or greater than F1+450 Hz, and among the resonance frequencies of each of the plurality of resonance modes, a resonance frequency closest to F2 is less than F2−100 Hz or greater than F2+450 Hz.

2. The micromirror device according to claim 1,
wherein the meandering type actuator part includes two or more rectangular plate-like parts, and the two or more rectangular plate-like parts are connected so as to be folded back through a connecting part.

3. The micromirror device according to claim 1,
wherein the upper electrode of each of the piezoelectric elements provided in each of the pair of semi-annular actuator parts includes a plurality of individual electrode parts, the plurality of individual electrode parts are disposed to be separated by stress inversion regions where positive and negative, of a principal stress component having a maximum absolute value among a principal stress generated in an in-plane direction of the piezoelectric film, are inverted, in a maximum displacement state, in a case of driving the mirror part in a first resonance mode in which the mirror part reciprocates and rotates around the first axis, and each of the piezoelectric elements includes a plurality of piezoelectric parts defined by each of the plurality of individual electrode parts.

4. The micromirror device according to claim 1,
wherein the connecting part connects the mirror part and one end of each of the pair of semi-annular actuator parts and connects the mirror part and another end of each the pair of semi-annular actuator parts on the first axis.

5. The micromirror device according to claim 1,
wherein the upper electrode of each of the piezoelectric elements of each of the pair of semi-annular actuator parts consists of a plurality of individual electrode parts formed symmetrically about the first axis.

6. The micromirror device according to claim 5,
wherein the upper electrode of each of the piezoelectric elements of each of the pair of semi-annular actuator parts consists of at least three individual electrode parts separated in a circumferential direction.

7. The micromirror device according to claim 1, further comprising:
a drive circuit that inputs driving signals to the piezoelectric elements of the first actuator and the second actuator.

8. The micromirror device according to claim 7,
wherein the drive circuit inputs, to the respective piezoelectric elements of the first actuator and the second actuator, driving signals for driving the micromirror device in a first resonance mode in which the mirror part reciprocates and rotates around the first axis and for driving the micromirror device in a second resonance mode in which the mirror part and the first actuator reciprocate and rotate around the second axis.

* * * * *